US012666667B2

(12) United States Patent
Yen et al.

(10) Patent No.: US 12,666,667 B2
(45) Date of Patent: Jun. 23, 2026

(54) TRANSISTOR CONTACTS AND METHODS OF FORMING THE SAME

(71) Applicant: Taiwan Semiconductor Manufacturing Co., Ltd., Hsinchu (TW)

(72) Inventors: Hung-Yu Yen, Taipei (TW); Keng-Chu Lin, Ping-Tung (TW)

(73) Assignee: Taiwan Semiconductor Manufacturing Co., Ltd., Hsinchu (TW)

( * ) Notice: Subject to any disclaimer, the term of this patent is extended or adjusted under 35 U.S.C. 154(b) by 482 days.

(21) Appl. No.: 18/193,878

(22) Filed: Mar. 31, 2023

(65) Prior Publication Data

US 2024/0332357 A1 Oct. 3, 2024

(51) Int. Cl.
| | |
|---|---|
| *H10D 62/10* | (2025.01) |
| *H10D 30/01* | (2025.01) |
| *H10D 30/43* | (2025.01) |
| *H10D 30/67* | (2025.01) |
| *H10D 64/01* | (2025.01) |
| *H10D 84/01* | (2026.01) |

(Continued)

(52) U.S. Cl.
CPC ......... *H10D 62/121* (2025.01); *H10D 30/014* (2025.01); *H10D 30/43* (2025.01); *H10D 30/6729* (2025.01); *H10D 30/6735* (2025.01); *H10D 30/6757* (2025.01); *H10D 64/017* (2025.01); *H10D 84/0167* (2025.01); *H10D 84/017* (2025.01); *H10D 84/0184* (2025.01); *H10D 84/038* (2025.01); *H10D 84/85* (2025.01)

(58) Field of Classification Search
CPC .... H10D 62/121; H10D 30/014; H10D 30/43; H10D 30/6729; H10D 30/6735; H10D 64/017; H10D 84/0167; H10D 84/017; H10D 84/0184; H10D 84/038; H10D 84/85; H10D 64/015; H10D 84/0149; H10D 84/0151; H10D 84/0158; H10D 84/834; H01L 21/76897; H01L 21/7682
See application file for complete search history.

(56) References Cited

U.S. PATENT DOCUMENTS

| | | | |
|---|---|---|---|
| 6,093,966 | A | 7/2000 | Venkatraman et al. |
| 9,105,490 | B2 | 8/2015 | Wang et al. |

(Continued)

FOREIGN PATENT DOCUMENTS

| | | |
|---|---|---|
| TW | 201644053 A | 12/2016 |
| TW | 202103260 A | 1/2021 |

(Continued)

*Primary Examiner* — William B Partridge
*Assistant Examiner* — David Paul Sedorook
(74) *Attorney, Agent, or Firm* — Slater Matsil, LLP

(57) ABSTRACT

In an embodiment, a method includes: forming a sacrificial spacer in a contact opening, the contact opening exposing a source/drain region; depositing a spacer layer on a sidewall of the sacrificial spacer and on a top surface of the source/ drain region; forming a protective dielectric on the spacer layer and in the contact opening; removing the sacrificial spacer to form a recess adjacent the spacer layer; and forming a dielectric cap in an upper portion of the recess by redepositing a material of the protective dielectric and a material of the spacer layer in the upper portion of the recess, the dielectric cap sealing a lower portion of the recess to form a void.

20 Claims, 27 Drawing Sheets

(51) Int. Cl.
  *H10D 84/03* (2025.01)
  *H10D 84/85* (2025.01)

(56) References Cited

U.S. PATENT DOCUMENTS

| | | | |
|---|---|---|---|
| 9,236,267 | B2 | 1/2016 | De et al. |
| 9,236,300 | B2 | 1/2016 | Liaw |
| 9,406,804 | B2 | 8/2016 | Huang et al. |
| 9,443,769 | B2 | 9/2016 | Wang et al. |
| 9,520,482 | B1 | 12/2016 | Chang et al. |
| 9,548,366 | B1 | 1/2017 | Ho et al. |
| 9,559,184 | B2 | 1/2017 | Ching et al. |
| 9,576,814 | B2 | 2/2017 | Wu et al. |
| 9,831,183 | B2 | 11/2017 | Lin et al. |
| 9,859,386 | B2 | 1/2018 | Ho et al. |
| 10,090,412 | B1* | 10/2018 | Cheng .................... H10B 63/34 |
| 10,468,500 | B1* | 11/2019 | Tsai ...................... H01L 21/324 |
| 10,505,022 | B2* | 12/2019 | Chiang ................ H10D 64/018 |
| 10,950,731 | B1* | 3/2021 | Peng ...................... H10D 30/43 |
| 2008/0220584 | A1* | 9/2008 | Kim .................... H01L 21/0217 |
| | | | 257/E21.243 |
| 2011/0156099 | A1* | 6/2011 | Hoentschel .......... H10D 62/021 |
| | | | 257/E21.403 |
| 2015/0084131 | A1* | 3/2015 | Chen .................. H10D 84/0181 |
| | | | 257/369 |
| 2019/0305085 | A1* | 10/2019 | Sung ...................... H10D 30/63 |
| 2020/0051906 | A1* | 2/2020 | Liaw ................ H01L 21/76829 |
| 2020/0303559 | A1* | 9/2020 | Huang ................ H01L 21/0217 |
| 2021/0233997 | A1* | 7/2021 | Chen .................. H01L 21/31116 |
| 2022/0231023 | A1 | 7/2022 | Ho et al. |
| 2024/0162083 | A1 | 5/2024 | Liang et al. |

FOREIGN PATENT DOCUMENTS

| | | |
|---|---|---|
| TW | 202133453 A | 9/2021 |
| TW | 202139359 A | 10/2021 |
| TW | 202230610 A | 8/2022 |

* cited by examiner

TRANSISTOR CONTACTS AND METHODS OF FORMING THE SAME

BACKGROUND

Semiconductor devices are used in a variety of electronic applications, such as, for example, personal computers, cell phones, digital cameras, and other electronic equipment. Semiconductor devices are typically fabricated by sequentially depositing insulating or dielectric layers, conductive layers, and semiconductor layers of material over a semiconductor substrate, and patterning the various material layers using lithography to form circuit components and elements thereon.

The semiconductor industry continues to improve the integration density of various electronic components (e.g., transistors, diodes, resistors, capacitors, etc.) by continual reductions in minimum feature size, which allow more components to be integrated into a given area. However, as the minimum features sizes are reduced, additional problems arise that should be addressed.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 2-25B are views of intermediate stages in the manufacturing of nanostructure-FETs, in accordance with some embodiments.

DETAILED DESCRIPTION

Figure 1:
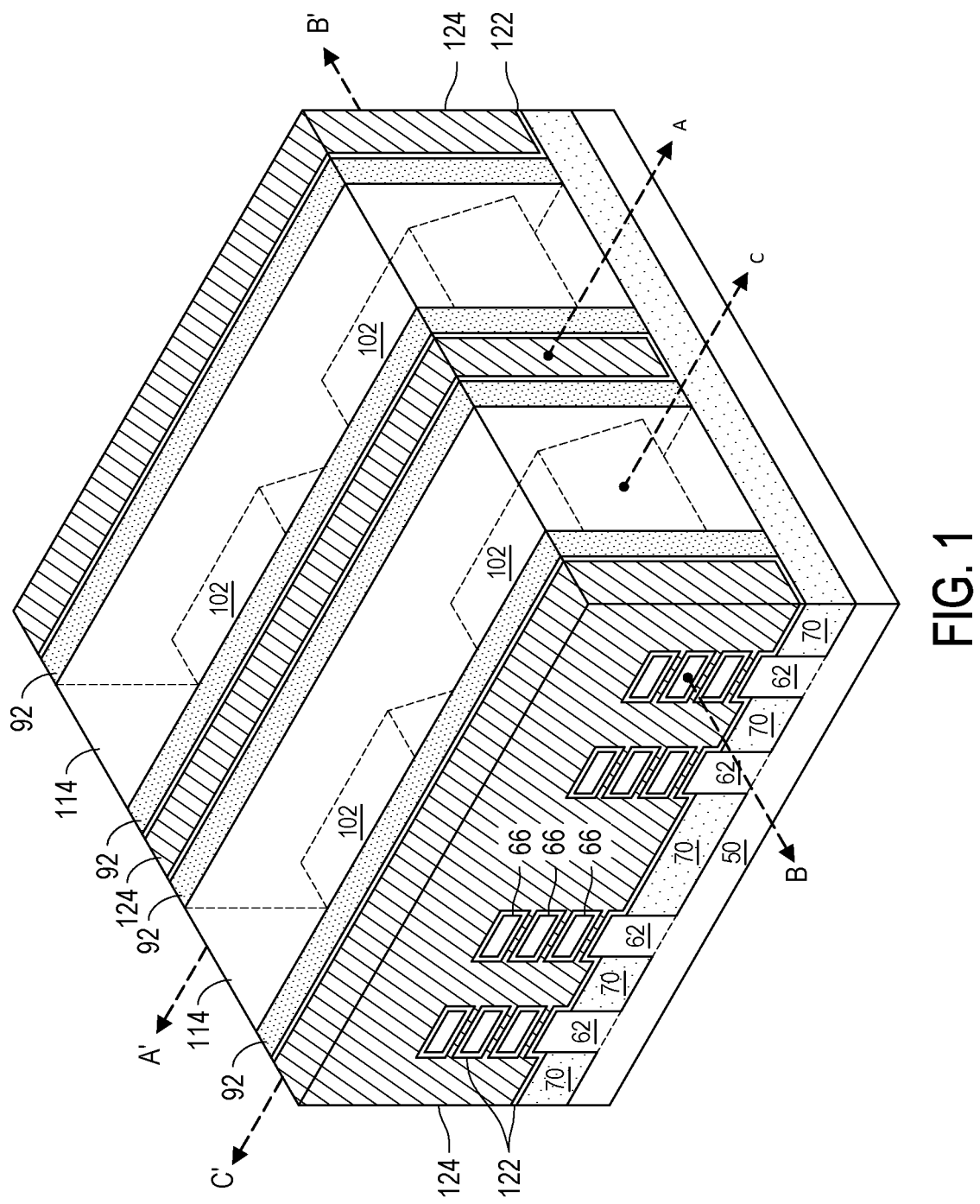
FIG. 1 illustrates an example of a nanostructure field-effect transistor (nanostructure-FET) in a three-dimensional view, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

According to various embodiments, voids are formed between source/drain contacts and adjacent gate electrodes. The voids provide a large amount of electrical isolation between the source/drain contacts and the gate electrodes, thus decreasing the parasitic capacitance of the resulting FinFETs. The voids are formed by removing sacrificial spacers and then forming dielectric caps that seal the area previously occupied by the sacrificial spacers. The dielectric caps are formed by performing a plasma treatment process that sputters and redeposits previously deposited materials. Forming the dielectric caps by redeposition of a material may allow the dielectric caps to be formed in a reliable, simple, and controllable manner.

FIG. 1 illustrates an example of nanostructure-FETs (e.g., nanowire FETs, nanosheet FETs, multi bridge channel (MBC) FETs, nanoribbon FETs, gate-all-around (GAA) FETs, or the like), in accordance with some embodiments. FIG. 1 is a three-dimensional view, where some features of the nanostructure-FETs are omitted for illustration clarity.

The nanostructure-FETs include nanostructures 66 (e.g., nanosheets, nanowires, or the like) over fins 62 on a substrate 50 (e.g., a semiconductor substrate), with the nanostructures 66 being semiconductor features that act as channel regions for the nanostructure-FETs. Isolation regions 70, such as shallow trench isolation (STI) regions, are disposed between adjacent fins 62, which may protrude above and from between neighboring isolation regions 70. The nanostructures 66 are disposed over and between adjacent isolation regions 70. Although the isolation regions 70 are described/illustrated as being separate from the substrate 50, as used herein, the term "substrate" may refer to the semiconductor substrate alone or a combination of the semiconductor substrate and the isolation regions. Additionally, although a bottom portion of the fins 62 are illustrated as being single, continuous materials with the substrate 50, the bottom portion of the fins 62 and/or the substrate 50 may include a single material or a plurality of materials. In this context, the fins 62 refer to the portion extending between the neighboring isolation regions 70.

Gate dielectrics 122 are over top surfaces of the fins 62 and along top surfaces, sidewalls, and bottom surfaces of the nanostructures 66. Gate electrodes 124 are over the gate dielectrics 122. Source/drain regions 102 are disposed on the fins 62 at opposing sides of the gate dielectrics 122 and the gate electrodes 124. Source/drain region(s) 102 may refer to a source or a drain, individually or collectively dependent upon the context. An inter-layer dielectric (ILD) 114 is formed over the source/drain regions 102. Contacts (subsequently described) to the source/drain regions 102 will be formed through the ILD 114. The source/drain regions 102 may be shared between various nanostructures 66. For example, adjacent source/drain regions 102 may be electrically connected, such as through coalescing the source/drain regions 102 by epitaxial growth, or through coupling the source/drain regions 102 with a same contact.

FIG. 1 further illustrates reference cross-sections that are used in later figures. Cross-section A-A' is along a longitudinal axis of a gate electrode 124. Cross-section B-B' is perpendicular to cross-section A-A' and is along a longitudinal axis of a fin 62 of a nanostructure-FET and in a direction of, for example, a current flow between the source/drain regions 102 of the nanostructure-FET. Cross-section C-C' is perpendicular to cross-section A-A' and extends through source/drain regions 102 of the nanostructure-FETs. Subsequent figures refer to these reference cross-sections for clarity.

Some embodiments discussed herein are discussed in the context of nanostructure-FETs formed using a gate-last process. In other embodiments, a gate-first process may be used. Also, some embodiments contemplate aspects used in planar devices, such as planar FETs, or in fin field-effect transistors (FinFETs), in lieu of or in combination with the nanostructure-FETs. For example, FinFETs may include semiconductor fins on a substrate, with the semiconductor fins being semiconductor features which act as channel regions for the FinFETs. Similarly, planar FETs may include a substrate, with planar portions of the substrate being semiconductor features which act as channel regions for the planar FETs.

FIGS. 2-25B are views of intermediate stages in the manufacturing of nanostructure-FETs, in accordance with some embodiments. FIGS. 2, 3, 4, 5, and 6 are three-dimensional views showing a similar three-dimensional view as FIG. 1. FIGS. 7A, 8A, 9A, 10A, 11A, 12A, 13A, 14A, 15A, 16A, 17A, 18A, 19A, 20A, 21A, 22A, 23A, 24A, and 25A illustrate cross-sectional views along a similar cross-section as reference cross-section A-A' in FIG. 1. FIGS. 7B, 8B, 9B, 10B, 11B, 12B, 13B, 14B, 15B, 16B, 17B, 18B, 19B, 20B, 21B, 22B, 23B, 24B, and 25B illustrate cross-sectional views along a similar cross-section as reference cross-section B-B' in FIG. 1. FIGS. 10C and 10D illustrate cross-sectional views along a similar cross-section as reference cross-section C-C' in FIG. 1.

Figure 2:
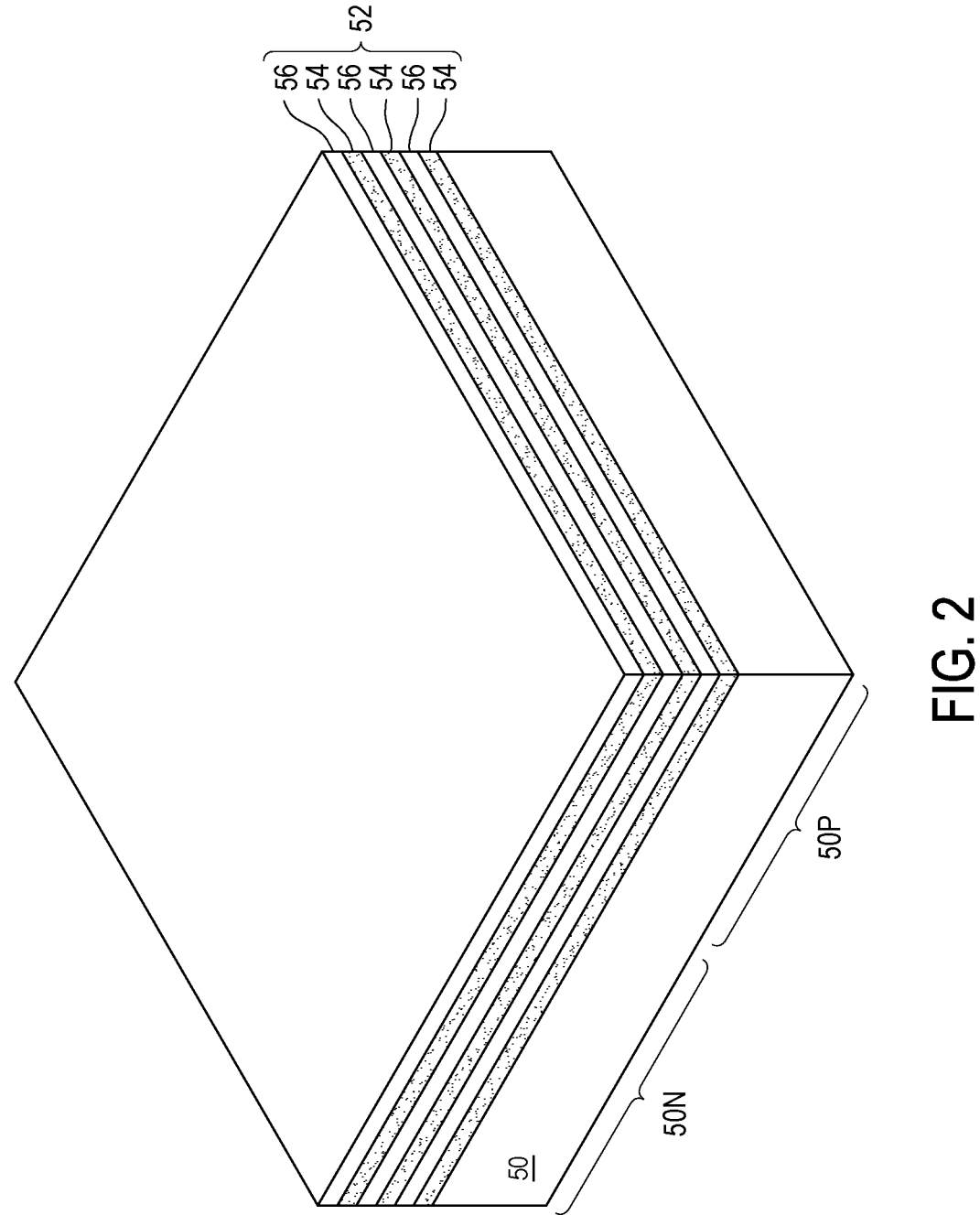

In FIG. 2, a substrate 50 is provided. The substrate 50 may be a semiconductor substrate, such as a bulk semiconductor, a semiconductor-on-insulator (SOI) substrate, or the like, which may be doped (e.g., with a p-type or an n-type dopant) or undoped. The substrate 50 may be a wafer, such as a silicon wafer. Generally, an SOI substrate is a layer of a semiconductor material formed on an insulator layer. The insulator layer may be, for example, a buried oxide (BOX) layer, a silicon oxide layer, or the like. The insulator layer is provided on a substrate, typically a silicon or glass substrate. Other substrates, such as a multi-layered or gradient substrate may also be used. In some embodiments, the semiconductor material of the substrate 50 may include silicon; germanium; a compound semiconductor including silicon carbide, gallium arsenide, gallium phosphide, indium phosphide, indium arsenide, and/or indium antimonide; an alloy semiconductor including silicon-germanium, gallium arsenide phosphide, aluminum indium arsenide, aluminum gallium arsenide, gallium indium arsenide, gallium indium phosphide, and/or gallium indium arsenide phosphide; or combinations thereof.

The substrate 50 has an n-type region 50N and a p-type region 50P. The n-type region 50N can be for forming n-type devices, such as NMOS transistors, e.g., n-type nanostructure-FETs, and the p-type region 50P can be for forming p-type devices, such as PMOS transistors, e.g., p-type nanostructure-FETs. The n-type region 50N may (or may not) be physically separated (not separately illustrated) from the p-type region 50P, and any number of device features (e.g., other active devices, doped regions, isolation structures, etc.) may be disposed between the n-type region 50N and the p-type region 50P. Although one n-type region 50N and one p-type region 50P are illustrated, any number of n-type regions 50N and p-type regions 50P may be provided.

A multi-layer stack 52 is formed over the substrate 50. The multi-layer stack 52 includes alternating first semiconductor layers 54 and second semiconductor layers 56. The first semiconductor layers 54 are formed of a first semiconductor material, and the second semiconductor layers 56 are formed of a second semiconductor material. The semiconductor materials may each be selected from the candidate semiconductor materials of the substrate 50.

In the illustrated embodiment, and as subsequently described in greater detail, the first semiconductor layers 54 will be removed and the second semiconductor layers 56 will patterned to form channel regions for the nanostructure-FETs in both the n-type region 50N and the p-type region 50P. In such embodiments, the channel regions in both the n-type region 50N and the p-type region 50P may have a same material composition (e.g., silicon or another semiconductor material) and be formed simultaneously. The first semiconductor layers 54 are dummy layers that will be removed in subsequent processing to expose the top surfaces and the bottom surfaces of the second semiconductor layers 56. The first semiconductor material of the first semiconductor layers 54 is a material that has a high etching selectivity from the etching of the second semiconductor layers 56, such as silicon germanium. The second semiconductor material of the second semiconductor layers 56 is a material suitable for both n-type and p-type devices, such as silicon.

In another embodiment (not separately illustrated), the first semiconductor layers 54 will be patterned to form channel regions for nanostructure-FETs in one type of region (e.g., the p-type region 50P), and the second semiconductor layers 56 will be patterned to form channel regions for nanostructure-FETs in another type of region (e.g., the n-type region 50N). The first semiconductor material of the first semiconductor layers 54 may be a material suitable for p-type devices, such as silicon germanium (e.g., $Si_xGe_{1-x}$, where x can be in the range of 0 to 1), pure germanium, a III-V compound semiconductor, a II-VI compound semiconductor, or the like. The second semiconductor material of the second semiconductor layers 56 may be a material suitable for n-type devices, such as silicon, silicon carbide, a III-V compound semiconductor, a II-VI compound semiconductor, or the like. The first semiconductor material and the second semiconductor material may have a high etching selectivity from the etching of one another, so that the first semiconductor layers 54 may be removed without significantly removing the second semiconductor layers 56 in the n-type region 50N, and the second semiconductor layers 56 may be removed without significantly removing the first semiconductor layers 54 in the p-type region 50P.

In the illustrated example, the multi-layer stack 52 includes three of the first semiconductor layers 54 and three of the second semiconductor layers 56. It should be appreciated that the multi-layer stack 52 may include any number of the first semiconductor layers 54 and the second semiconductor layers 56. Each of the layers of the multi-layer stack 52 may be grown by a process such as vapor phase epitaxy (VPE) or molecular beam epitaxy (MBE), deposited by a process such as chemical vapor deposition (CVD) or atomic layer deposition (ALD), or the like. In some embodiments, some layers of the multi-layer stack 52 are formed to be thinner than other layers of the multi-layer stack 52.

Figure 3:
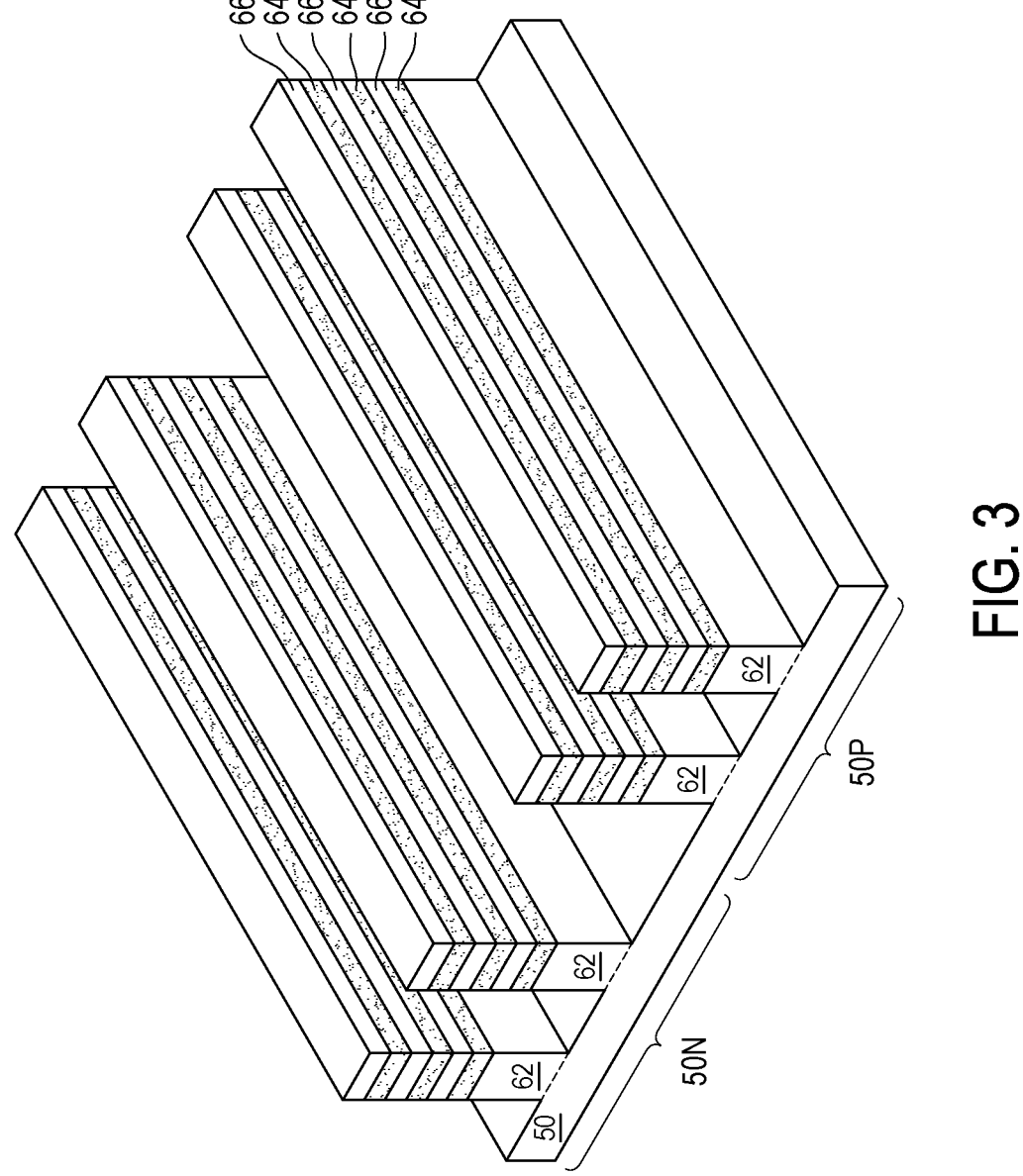

In FIG. 3, fins 62 are formed in the substrate 50 and nanostructures 64, 66 are formed in the multi-layer stack 52. In some embodiments, the nanostructures 64, 66 and the fins 62 may be formed in the multi-layer stack 52 and the substrate 50, respectively, by etching trenches in the multi-layer stack 52 and the substrate 50. The etching may be any acceptable etch process, such as a reactive ion etch (RIE), neutral beam etch (NBE), the like, or a combination thereof. The etching may be anisotropic. Forming the nanostructures 64, 66 by etching the multi-layer stack 52 may define first nanostructures 64 from the first semiconductor layers 54 and define second nanostructures 66 from the second semiconductor layers 56.

The fins 62 and the nanostructures 64, 66 may be patterned by any suitable method. For example, the fins 62 and the nanostructures 64, 66 may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the fins 62 and the nanostructures 64, 66.

The nanostructures 64, 66 are illustrated as having substantially equal widths in both the n-type region 50N and the p-type region 50P. In some embodiments, the widths of the nanostructures 64, 66 in the n-type region 50N may be greater or less than the width of the nanostructures 64, 66 in the p-type region 50P. The nanostructures 64, 66 in the n-type region 50N may have the same thickness as the nanostructures 64, 66 in the p-type region 50P. Further, while each of the fins 62 and the nanostructures 64, 66 are illustrated as having a constant width throughout, in other embodiments, the fins 62 and/or the nanostructures 64, 66 may have tapered sidewalls such that a width of each of the fins 62 and/or the nanostructures 64, 66 continuously increases in a direction towards the substrate 50. In such embodiments, each of the nanostructures 64, 66 may have a different width and be trapezoidal in shape.

Figure 4:
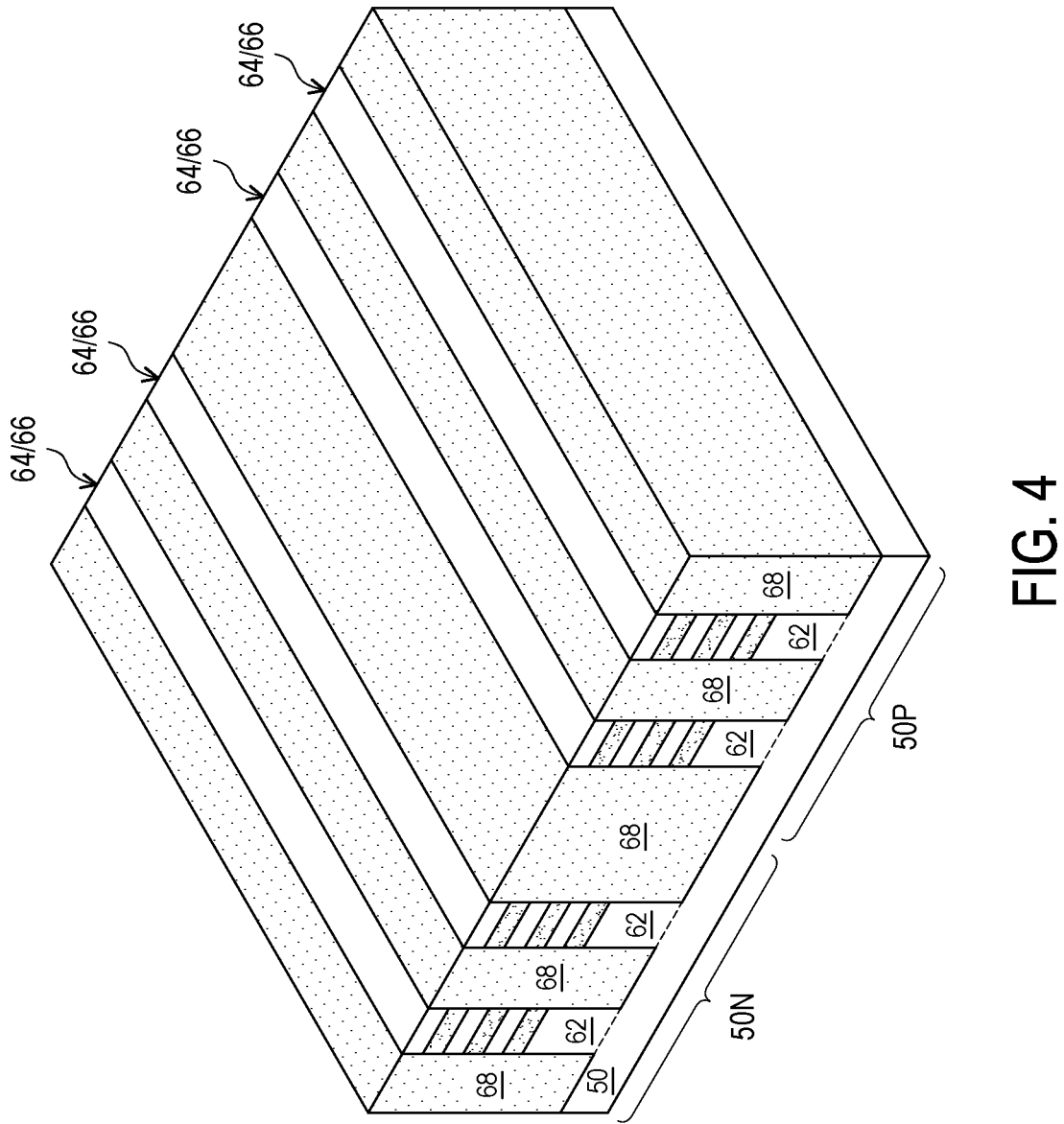

In FIG. 4, an insulation material 68 is formed over the substrate 50 and between adjacent fins 62 and adjacent nanostructures 64, 66. The insulation material 68 may be an oxide, such as silicon oxide, a nitride, the like, or a combination thereof, and may be formed by high-density plasma CVD (HDP-CVD), flowable CVD (FCVD), the like, or a combination thereof. Other insulation materials formed by any acceptable process may be used. In some embodiments, the insulation material 68 includes silicon oxide formed by an FCVD process. An annealing process may be performed once the insulation material 68 is formed. Although the insulation material 68 is illustrated as a single layer, some embodiments may utilize multiple layers. For example, in some embodiments a liner (not separately illustrated) may first be formed along a surface of the substrate 50, the fins 62, and the nanostructures 64, 66. Thereafter, a fill material, such as one of the previously described insulation materials may be formed over the liner.

The insulation material 68 may be deposited over the fins 62 and nanostructures 64, 66 such that excess insulation material 68 covers the nanostructures 64, 66. A removal process is then applied to the insulation material 68 to remove excess insulation material 68 over the nanostructures 64, 66. In some embodiments, a planarization process such as a chemical mechanical polish (CMP), an etch-back process, combinations thereof, or the like may be utilized. The planarization process exposes the nanostructures 64, 66 such that top surfaces of the nanostructures 64, 66 and the insulation material 68 are level after the planarization process is complete.

Figure 5:
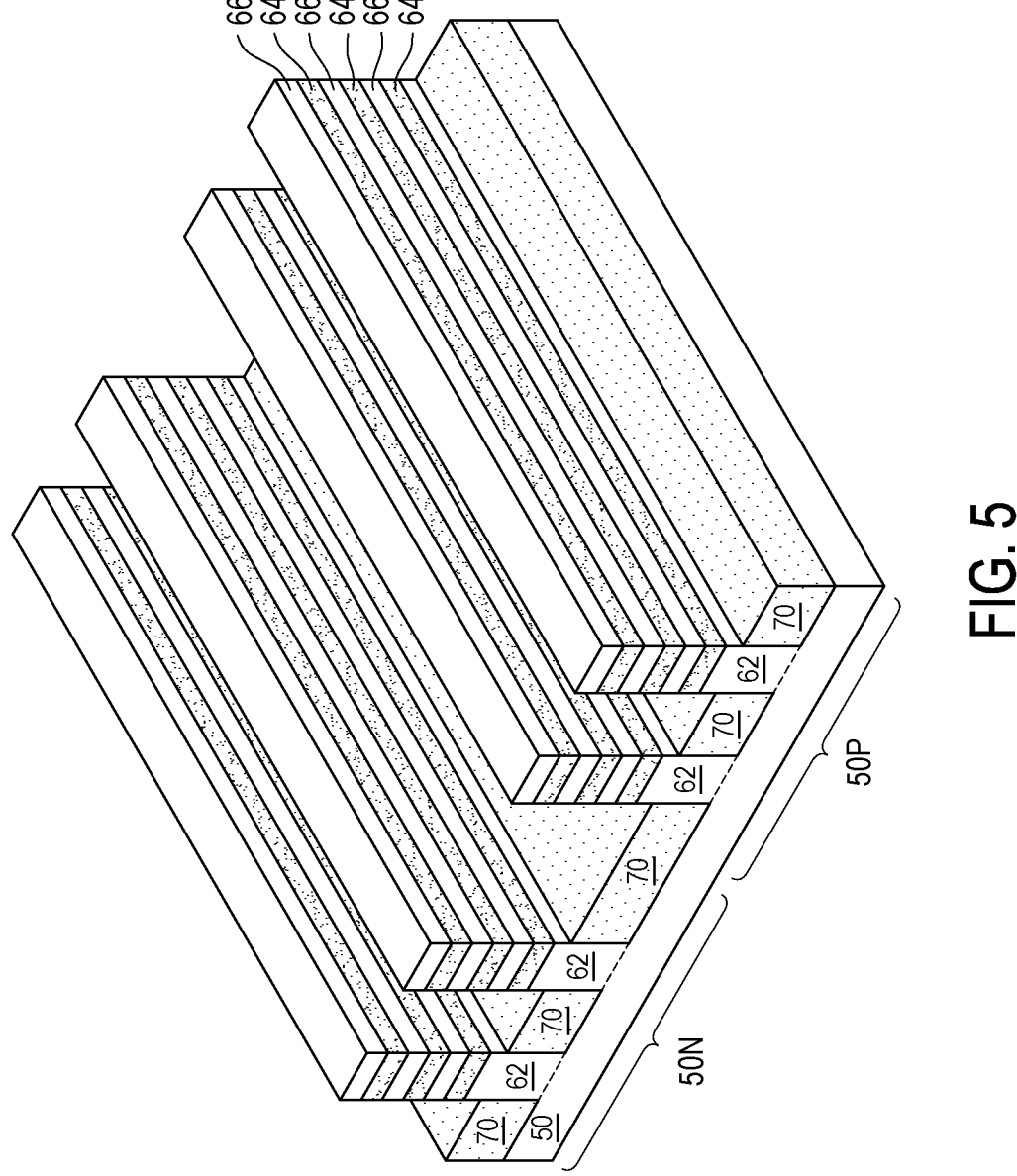

In FIG. 5, the insulation material 68 is recessed to form isolation regions 70. The isolation regions 70 are adjacent the fins 62. The insulation material 68 is recessed such that upper portions of fins 62 and/or the nanostructures 64, 66 protrude from between neighboring isolation regions 70. The upper portions of the fins 62 and/or the nanostructures 64, 66 are above the isolation regions 70. Further, the top surfaces of the isolation regions 70 may have a flat surface as illustrated, a convex surface, a concave surface (such as dishing), or a combination thereof. The top surfaces of the isolation regions 70 may be formed flat, convex, and/or concave by an appropriate etch. The isolation regions 70 may be recessed using any acceptable etching process, such as one that is selective to the material of the insulation material 68 (e.g., selectively etches the material of the insulation material 68 at a faster rate than the materials of the fins 62 and the nanostructures 64, 66). For example, an oxide removal using, for example, dilute hydrofluoric (dHF) acid may be used.

The previously described process is just one example of how the fins 62 and the nanostructures 64, 66 may be formed. In some embodiments, the fins 62 and/or the nanostructures 64, 66 may be formed using a mask and an epitaxial growth process. For example, a dielectric layer can be formed over a top surface of the substrate 50, and trenches can be etched through the dielectric layer to expose the underlying substrate 50. Epitaxial structures can be epitaxially grown in the trenches, and the dielectric layer can be recessed such that the epitaxial structures protrude from the dielectric layer to form the fins 62 and/or the nanostructures 64, 66. The epitaxial structures may include the previously described alternating semiconductor materials, such as the first semiconductor materials and the second semiconductor materials. In some embodiments where epitaxial structures are epitaxially grown, the epitaxially grown materials may be in situ doped during growth, which may obviate prior and/or subsequent implantations, although in situ and implantation doping may be used together.

Further, appropriate wells (not separately illustrated) may be formed in the fins 62, the nanostructures 64, 66, and/or the isolation regions 70. In embodiments with different well types, different implant steps for the n-type region 50N and the p-type region 50P may be achieved using a photoresist or other mask (not separately illustrated). For example, a photoresist may be formed over the fins 62, the nanostructures 64, 66, and the isolation regions 70 in the n-type region 50N and the p-type region 50P. The photoresist is patterned to expose the p-type region 50P. The photoresist can be formed by using a spin-on technique and can be patterned using acceptable photolithography techniques. Once the photoresist is patterned, an n-type impurity implant is performed in the p-type region 50P, and the photoresist may act as a mask to substantially prevent n-type impurities from being implanted into the n-type region 50N. The n-type impurities may be phosphorus, arsenic, antimony, or the like implanted in the region to a concentration in a range from $10^{13}$ atoms/cm$^3$ to $10^{14}$ atoms/cm$^3$. After the implant, the photoresist is removed, such as by any acceptable ashing process.

Following or prior to the implanting of the p-type region 50P, a photoresist or other mask (not separately illustrated) is formed over the fins 62, the nanostructures 64, 66, and the isolation regions 70 in the p-type region 50P and the n-type region 50N. The photoresist is patterned to expose the n-type region 50N. The photoresist can be formed by using a spin-on technique and can be patterned using acceptable photolithography techniques. Once the photoresist is patterned, a p-type impurity implant may be performed in the n-type region 50N, and the photoresist may act as a mask to substantially prevent p-type impurities from being implanted into the p-type region 50P. The p-type impurities may be boron, boron fluoride, indium, or the like implanted in the region to a concentration in a range from $10^{13}$ atoms/cm$^3$ to $10^{14}$ atoms/cm$^3$. After the implant, the photoresist may be removed, such as by any acceptable ashing process.

After the implants of the n-type region 50N and the p-type region 50P, an anneal may be performed to repair implant damage and to activate the p-type and/or n-type impurities that were implanted. In some embodiments, the grown materials of epitaxial fins may be in situ doped during growth, which may obviate the implantations, although in situ and implantation doping may be used together.

Figure 6:
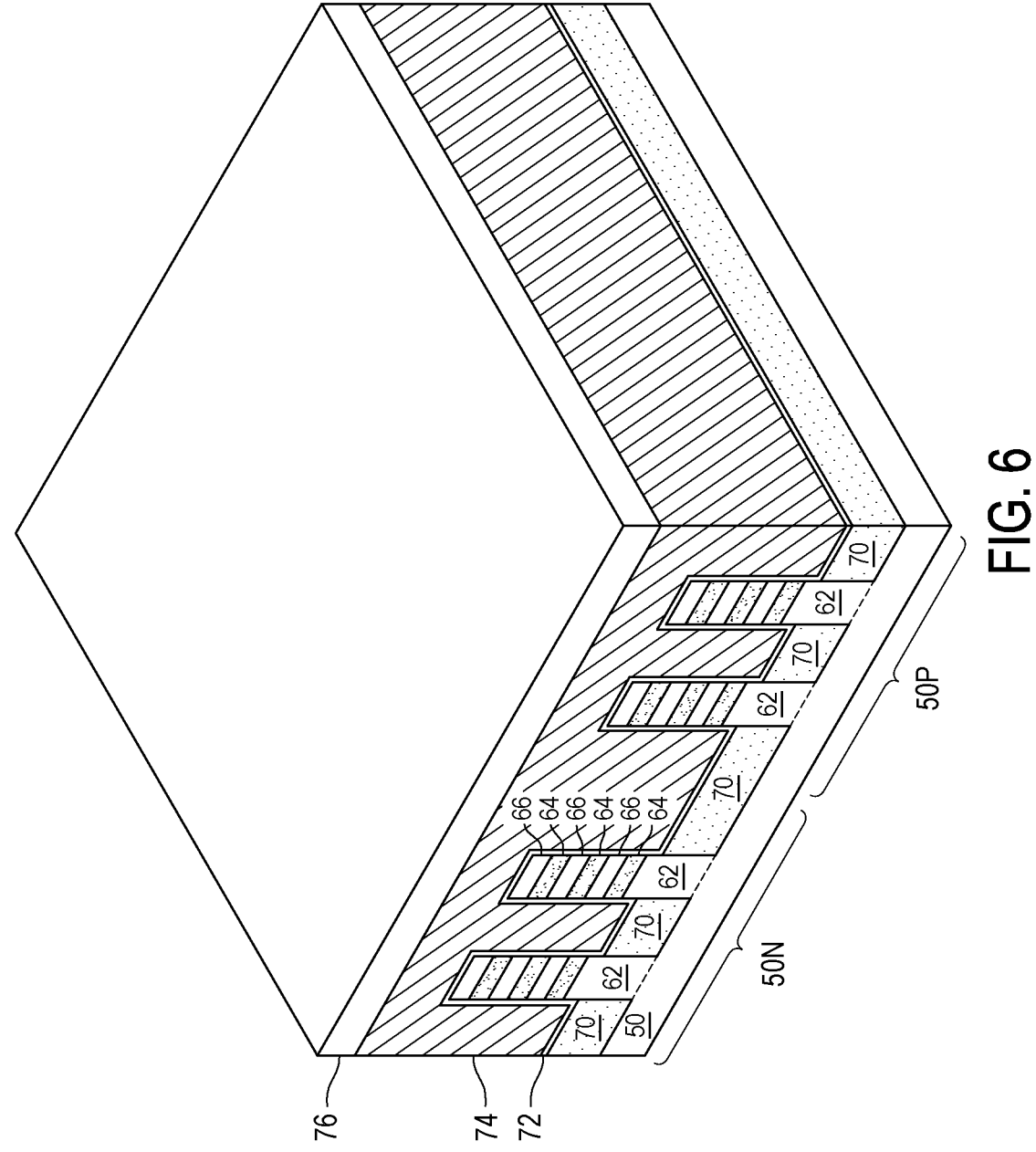

In FIG. 6, a dummy dielectric layer 72 is formed on the fins 62 and/or the nanostructures 64, 66. The dummy dielectric layer 72 may be formed of silicon oxide, silicon nitride, a combination thereof, or the like, which may be deposited or thermally grown according to acceptable techniques. A dummy gate layer 74 is formed over the dummy dielectric layer 72, and a mask layer 76 is formed over the dummy gate layer 74. The dummy gate layer 74 may be deposited over the dummy dielectric layer 72 and then planarized, such as by a chemical mechanical polish (CMP). The dummy gate layer 74 may be formed of a conductive or non-conductive material and may be selected from a group including amorphous silicon, polycrystalline-silicon (polysilicon), polycrystalline silicon-germanium (poly-SiGe), metallic nitrides, metallic silicides, metallic oxides, and metals. The material of the dummy gate layer 74 may be deposited by CVD, physical vapor deposition (PVD), sputter deposition, or other techniques for depositing the selected material. The dummy gate layer 74 may be formed of other materials that have a high etching selectivity from the etching of insulation materials, e.g., the isolation regions 70 and/or the dummy dielectric layer 72. The mask layer 76 may be deposited over the dummy gate layer 74. The mask layer 76 may be formed of a dielectric material such as silicon nitride, silicon oxynitride, or the like. In this example, a single dummy gate layer 74 and a single mask layer 76 are formed across the n-type region 50N and the p-type region 50P. In the illustrated embodiment, the dummy dielectric layer 72 covers the isolation regions 70, such that the dummy dielectric layer 72 extends between the dummy gate layer 74 and the isolation regions 70. In another embodiment, the dummy dielectric layer 72 covers only the fins 62 and/or the nanostructures 64, 66.

FIGS. 7A-25B illustrate various additional steps in the manufacturing of embodiment devices. FIGS. 7A-25B illustrate features in either of the n-type region 50N and the p-type region 50P. For example, the structures illustrated may be applicable to both the n-type region 50N and the p-type region 50P. Differences (if any) in the structures of the n-type region 50N and the p-type region 50P will be explained in the description of each figure.

Figures 7A, 7B:
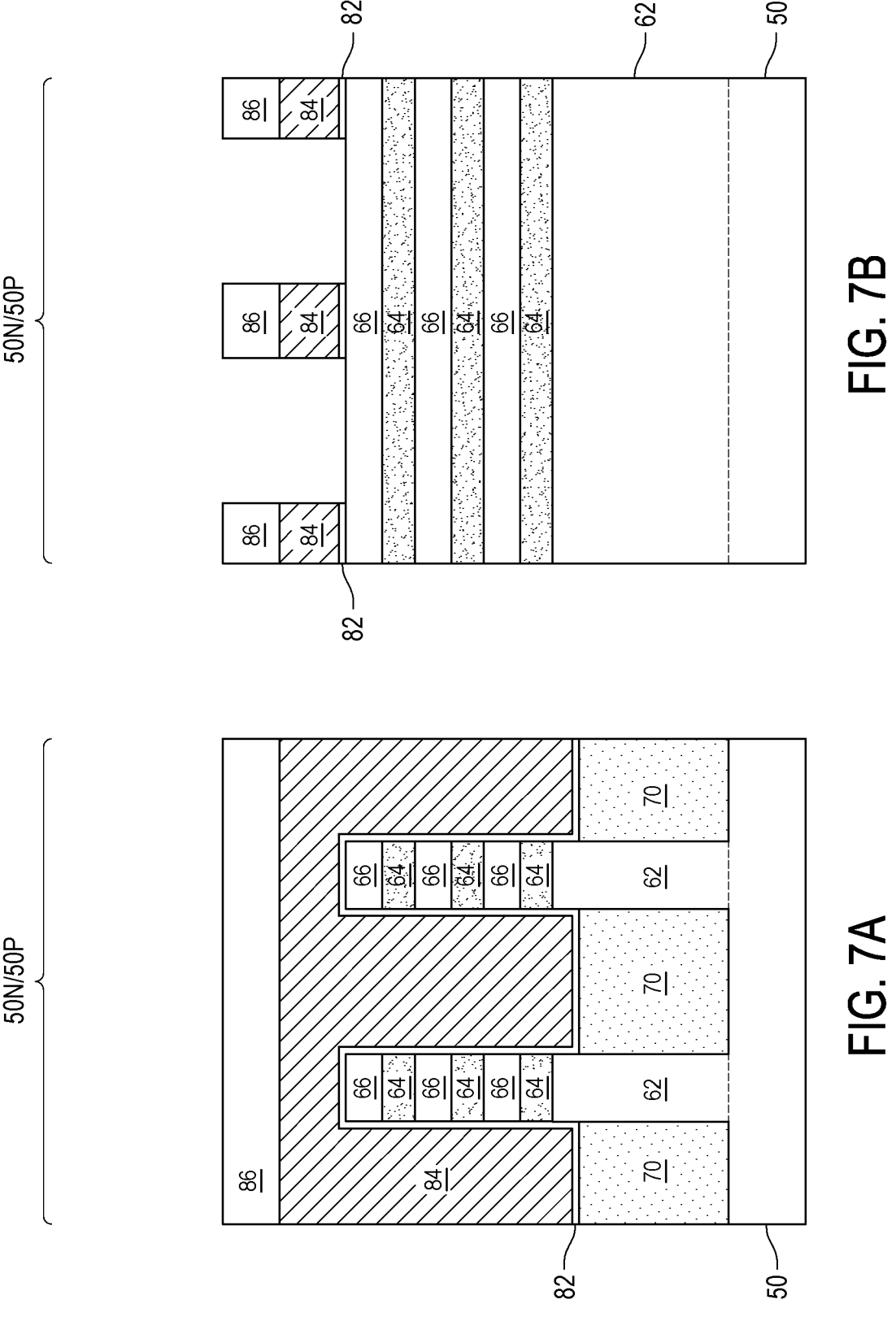

In FIGS. 7A-7B, the mask layer 76 is patterned using acceptable photolithography and etching techniques to form masks 86. The pattern of the masks 86 then may be transferred to the dummy gate layer 74 and to the dummy dielectric layer 72 to form dummy gates 84 and dummy dielectrics 82, respectively. The dummy gates 84 cover respective channel regions of the nanostructures 64, 66. The pattern of the masks 86 may be used to physically separate each of the dummy gates 84 from adjacent dummy gates 84. The dummy gates 84 may also have a lengthwise direction substantially perpendicular to the lengthwise direction of respective fins 62. The masks 86 can optionally be removed after patterning, such as by any acceptable etching technique.

Figures 8A, 8B:
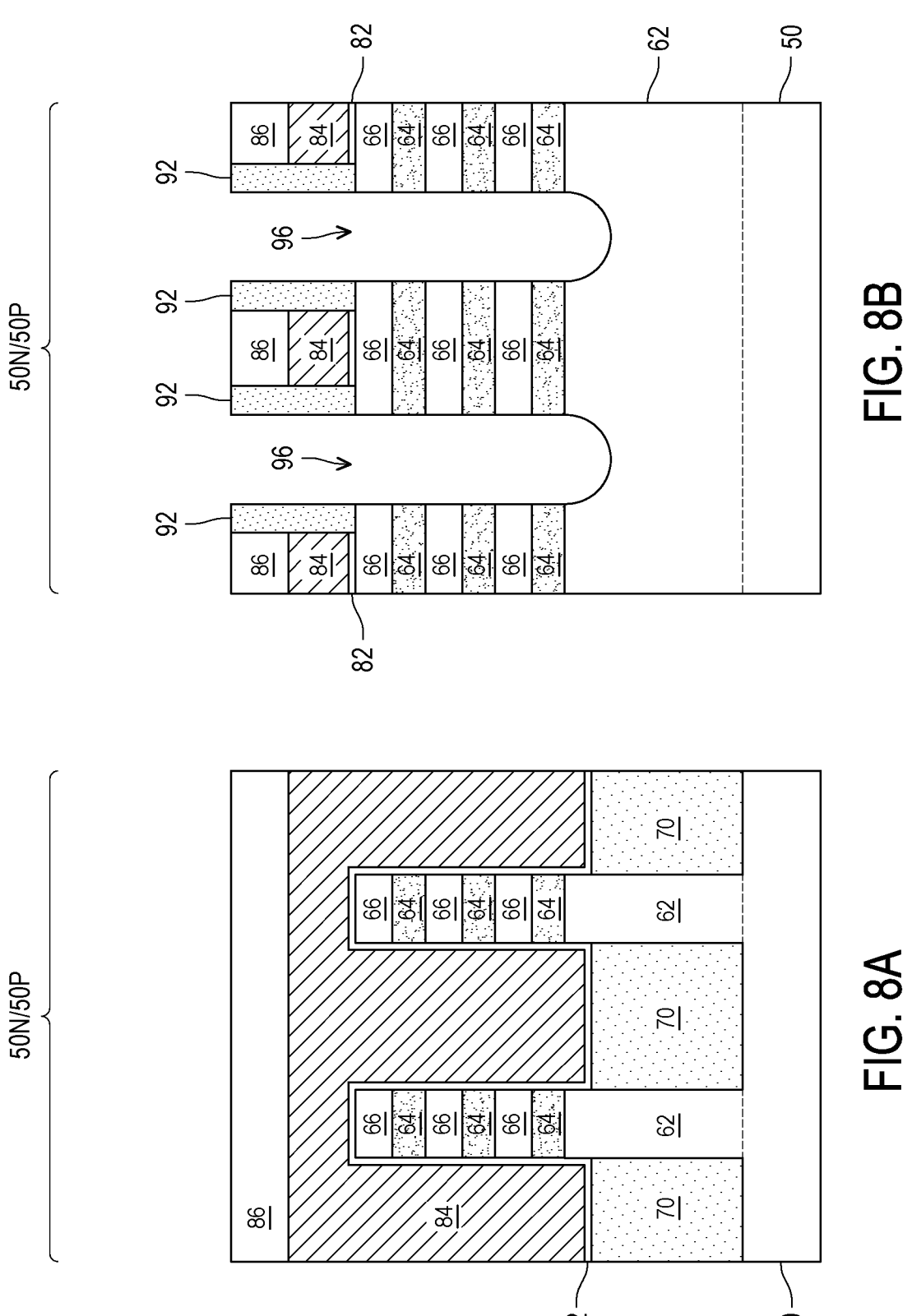

In FIGS. 8A-8B, gate spacers 92 are formed over the nanostructures 64, 66 and the isolation regions 70, on exposed sidewalls of the masks 86 (if present), the dummy gates 84, and the dummy dielectrics 82. The gate spacers 92 may be formed by conformally forming one or more dielectric material(s) and subsequently etching the dielectric material(s). Acceptable dielectric materials may include silicon oxide, silicon nitride, silicon oxynitride, silicon oxycarbonitride, or the like, which may be formed by a deposition process such as chemical vapor deposition (CVD), atomic layer deposition (ALD), or the like. Other insulation materials formed by any acceptable process may be used. Any acceptable etch process, such as a dry etch, a wet etch, the like, or a combination thereof, may be performed to pattern the dielectric material(s). The etching may be anisotropic. The dielectric material(s), when etched, have portions left on the sidewalls of the dummy gates 84 (thus forming the gate spacers 92). As will be subsequently described in greater detail, the dielectric material(s), when etched, may also have portions left on the sidewalls of the fins 62 and/or the nanostructures 64, 66 (thus forming fin spacers 94, see FIGS. 10C-10D). After etching, the fin spacers 94 and/or gate spacers 92 can have straight sidewalls (as illustrated) or can have curved sidewalls (not separately illustrated).

Further, implants for lightly doped source/drain (LDD) regions (not separately illustrated) may be performed. The LDD implants may be performed before the gate spacers 92 are formed. In embodiments with different device types, similar to the implants for the previously described wells, a mask, such as a photoresist, may be formed over the n-type region 50N, while exposing the p-type region 50P, and appropriate type (e.g., p-type) impurities may be implanted into the fins 62 and the nanostructures 64, 66 exposed in the p-type region 50P. The mask may then be removed. Subsequently, a mask, such as a photoresist, may be formed over the p-type region 50P while exposing the n-type region 50N, and appropriate type impurities (e.g., n-type) may be implanted into the fins 62 and the nanostructures 64, 66 exposed in the n-type region 50N. The mask may then be removed. The n-type impurities may be the any of the n-type impurities previously discussed, and the p-type impurities may be the any of the p-type impurities previously discussed. The lightly doped source/drain regions may have a concentration of impurities in a range from $10^{15}$ atoms/cm$^3$ to $10^{19}$ atoms/cm$^3$. An anneal may be used to repair implant damage and to activate the implanted impurities.

It is noted that the previous disclosure generally describes a process of forming spacers and LDD regions. Other processes and sequences may be used. For example, fewer or additional spacers may be utilized, different sequence of steps may be utilized, additional spacers may be formed and removed, and/or the like. Furthermore, the n-type devices and the p-type devices may be formed using different structures and steps.

Source/drain recesses 96 are patterned in the fins 62, the nanostructures 64, 66, and the substrate 50. Epitaxial source/drain regions will be subsequently formed in the source/drain recesses 96. The source/drain recesses 96 may extend through the nanostructures 64, 66 and into the substrate 50. In some embodiments, the fins 62 may be etched such that bottom surfaces of the source/drain recesses 96 are disposed below the top surfaces of the isolation regions 70. The source/drain recesses 96 may be formed by etching the fins 62, the nanostructures 64, 66, and the substrate 50 using anisotropic etching processes, such as RIE, NBE, or the like. The gate spacers 92 and the dummy gates 84 mask portions of the fins 62, the nanostructures 64, 66, and the substrate 50 during the etching processes used to form the source/drain recesses 96. A single etch process or multiple etch processes may be used to etch each layer of the nanostructures 64, 66 and/or the fins 62. Timed etch processes may be used to stop the etching of the source/drain recesses 96 after the source/drain recesses 96 reach a desired depth.

Figures 9A, 9B:
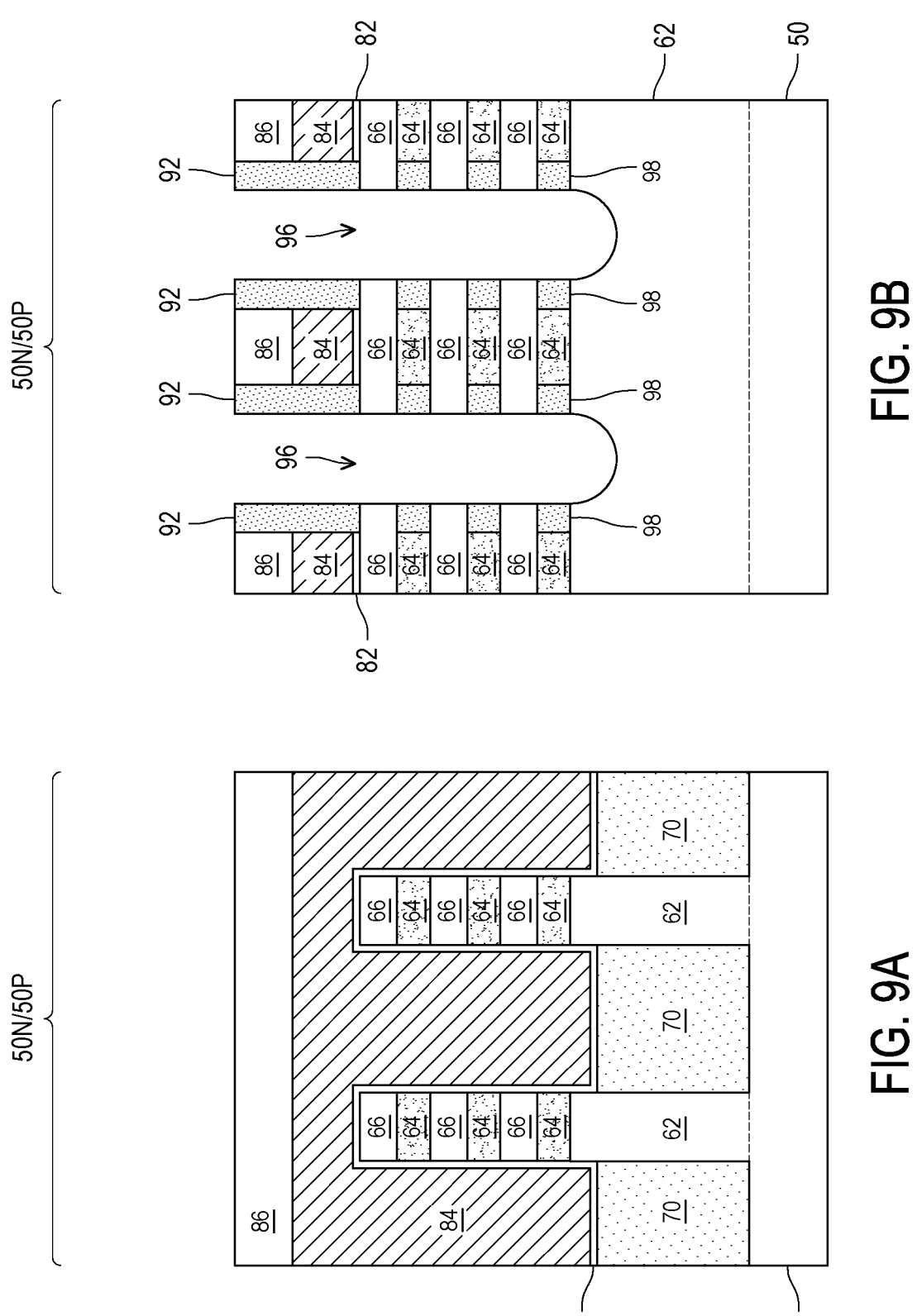

In FIGS. 9A-9B, inner spacers 98 are formed on the sidewalls of the remaining portions of the first nanostructures 64, e.g., those sidewalls exposed by the source/drain recesses 96. As will be subsequently described in greater detail, source/drain regions will be subsequently formed in the source/drain recesses 96, and the first nanostructures 64 will be subsequently replaced with corresponding gate structures. The inner spacers 98 act as isolation features between the subsequently formed source/drain regions and the subsequently formed gate structures. Further, the inner spacers 98 may be used to prevent damage to the subsequently formed source/drain regions by subsequent etch processes, such as etch processes used to subsequently remove the first nanostructures 64.

As an example to form the inner spacers 98, the source/drain recesses 96 can be laterally expanded. Specifically, portions of the sidewalls of the first nanostructures 64 exposed by the source/drain recesses 96 may be recessed to form sidewall recesses. Although sidewalls of the first nanostructures 64 are illustrated as being straight, the sidewalls may be concave or convex. The sidewalls may be recessed by any acceptable etch process, such as one that is selective to the material of the first nanostructures 64 (e.g., selectively etches the material of the first nanostructures 64 at a faster rate than the material of the second nanostructures 66). The etching may be isotropic. For example, when the second nanostructures 66 are formed of silicon and the first nanostructures 64 are formed of silicon germanium, the etch process may be a wet etch using tetramethylammonium hydroxide (TMAH), ammonium hydroxide ($NH_4OH$), or the like. In another embodiment, the etch process may be a dry etch using a fluorine-based gas such as hydrogen fluoride (HF) gas. In some embodiments, the same etch process may be continually performed to both form the source/drain recesses 96 and recess the sidewalls of the first nanostructures 64. The inner spacers 98 can then be formed by conformally forming an insulating material in the source/drain recesses 96 (including the sidewall recesses), and subsequently etching the insulating material. The insulating material may be silicon nitride or silicon oxynitride, although any suitable material, such as low-dielectric constant (low-k) materials having a k-value less than about 3.5, may be utilized. The insulating material may be formed by a deposition process, such as ALD, CVD, or the like. The etching of the insulating material may be anisotropic. For example, the etch process may be a dry etch such as a RIE, a NBE, or the like. The insulating material, when etched, has portions remaining in the sidewall recesses (thus forming the inner spacers 98).

Although outer sidewalls of inner spacers 98 are illustrated as being flush with sidewalls of the second nanostructures 66, the outer sidewalls of the inner spacers 98 may extend beyond or be recessed from sidewalls of the second nanostructures 66. In other words, the inner spacers 98 may partially fill, completely fill, or overfill the sidewall recesses. Moreover, although the sidewalls of the inner spacers 98 are illustrated as being straight, the sidewalls of the inner spacers 98 may be concave or convex.

Figures 10A, 10B:
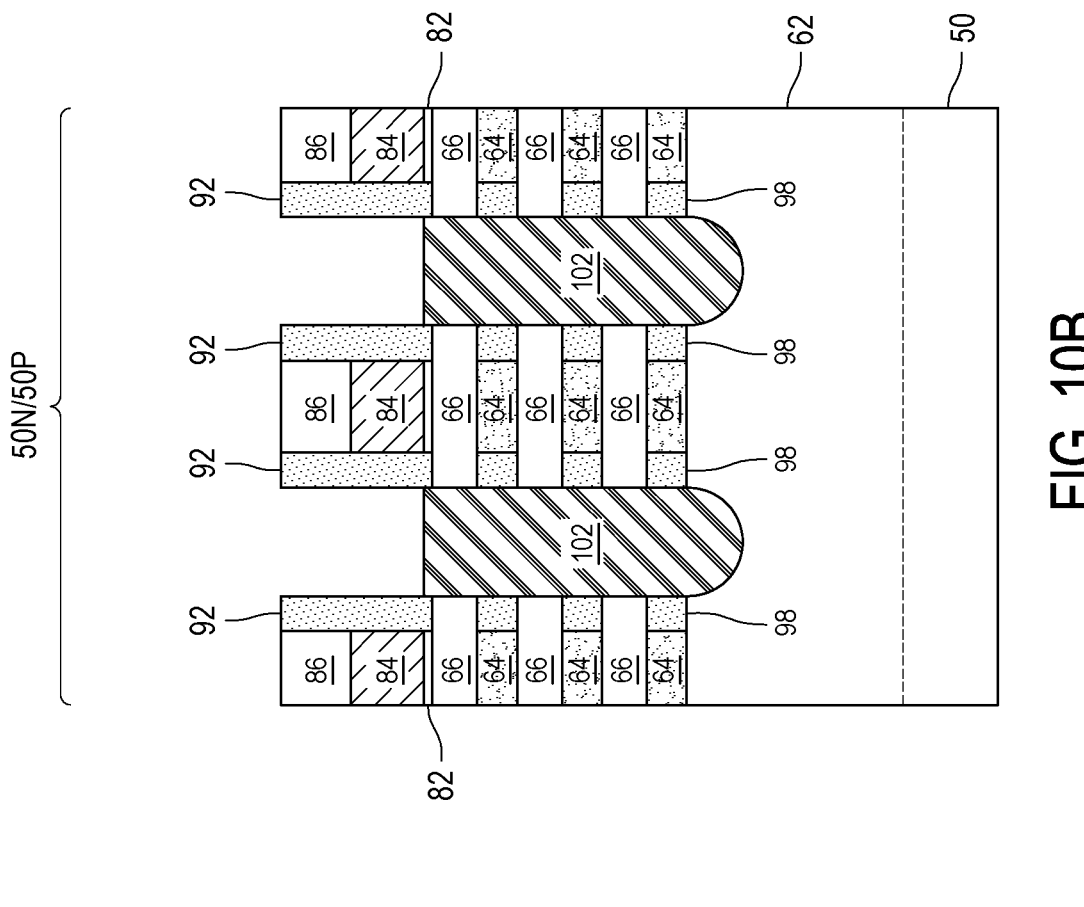
Figures 10C, 10D:
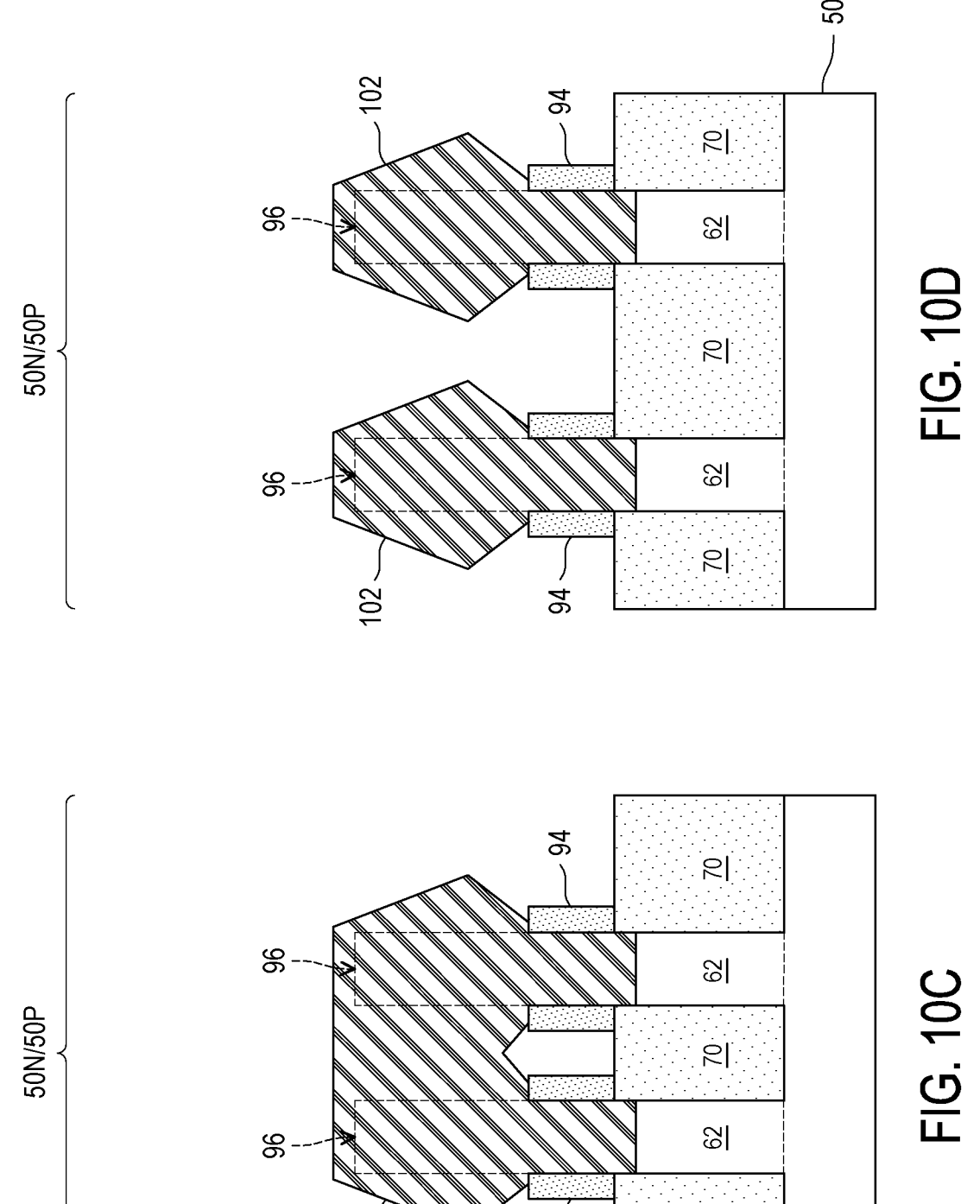

In FIGS. 10A-10B, epitaxial source/drain regions 102 are formed in the source/drain recesses 96. In some embodiments, the epitaxial source/drain regions 102 exert stress in the respective channel regions of the second nanostructures 66, thereby improving performance. The epitaxial source/drain regions 102 are formed in the source/drain recesses 96 such that each dummy gate 84 is disposed between respective neighboring pairs of the epitaxial source/drain regions 102. In some embodiments, the gate spacers 92 are used to separate the epitaxial source/drain regions 102 from the dummy gates 84 and the inner spacers 98 are used to separate the epitaxial source/drain regions 102 from the nanostructures 64 by an appropriate lateral distance so that the epitaxial source/drain regions 102 do not short out with subsequently formed gates of the resulting nanostructure-FETs.

The epitaxial source/drain regions 102 in the n-type region 50N may be formed by masking the p-type region 50P. Then, the epitaxial source/drain regions 102 are epitaxially grown in the source/drain recesses 96 in the n-type region 50N. The epitaxial source/drain regions 102 may include any acceptable material appropriate for n-type nanostructure-FETs. For example, if the second nanostructures 66 are formed of silicon, the epitaxial source/drain regions 102 may include materials exerting a tensile strain on the second nanostructures 66, such as silicon, silicon carbide, phosphorous doped silicon carbide, silicon phosphide, or the like. The epitaxial source/drain regions 102 in the n-type region 50N may be referred to as "n-type source/drain regions." The epitaxial source/drain regions 102 may have surfaces raised from respective upper surfaces of the nanostructures 64, 66 and may have facets.

The epitaxial source/drain regions 102 in the p-type region 50P may be formed by masking the n-type region 50N. Then, the epitaxial source/drain regions 102 are epitaxially grown in the source/drain recesses 96 in the p-type region 50P. The epitaxial source/drain regions 102 may include any acceptable material appropriate for p-type nanostructure-FETs. For example, if the second nanostructures 66 are formed of silicon, the epitaxial source/drain regions 102 may include materials exerting a compressive strain on the first nanostructures 64, such as silicon-germanium, boron doped silicon-germanium, germanium, germanium tin, or the like. The epitaxial source/drain regions 102 in the p-type region 50P may be referred to as "p-type source/drain regions." The epitaxial source/drain regions 102 may also have surfaces raised from respective surfaces of the nanostructures 64, 66 and may have facets.

The epitaxial source/drain regions 102, the nanostructures 64, 66, and/or the fins 62 may be implanted with dopants to form source/drain regions, similar to the process previously discussed for forming lightly-doped source/drain regions, followed by an anneal. The source/drain regions may have an impurity concentration of between $10^{19}$ atoms/$cm^3$ and $10^{21}$ atoms/$cm^3$. The n-type and/or p-type impurities for source/drain regions may be any of the impurities previously discussed. In some embodiments, the epitaxial source/drain regions 102 may be in situ doped during growth.

As a result of the epitaxy processes used to form the epitaxial source/drain regions 102, upper surfaces of the epitaxial source/drain regions 102 have facets which expand laterally outward beyond sidewalls of the nanostructures 64, 66. In some embodiments, these facets cause adjacent epitaxial source/drain regions 102 of a same nanostructure-FET to merge as illustrated by FIG. 10C. In other embodiments, adjacent epitaxial source/drain regions 102 remain separated after the epitaxy process is completed as illustrated by FIG. 10D. In the illustrated embodiments, the fin spacers 94 are formed on a top surface of the isolation regions 70, thereby blocking the epitaxial growth. In some other embodiments, the fin spacers 94 may cover portions of the sidewalls of the nanostructures 64, 66 and/or the fins 62, further blocking the epitaxial growth. In another embodiment, the spacer etch used to form the gate spacers 92 is adjusted to not form the fin spacers 94, so as to allow the epitaxial source/drain regions 102 to extend to the surface of the isolation regions 70.

The epitaxial source/drain regions 102 may include one or more semiconductor material layers. For example, the epitaxial source/drain regions 102 may include a first semiconductor material layer, a second semiconductor material layer, and a third semiconductor material layer. Any number of semiconductor material layers may be used for the epitaxial source/drain regions 102. Each of the first semiconductor material layer, the second semiconductor material layer, and the third semiconductor material layer may be formed of different semiconductor materials and may be doped to different dopant concentrations. In some embodiments, the first semiconductor material layer may have a dopant concentration less than the second semiconductor material layer and greater than the third semiconductor material layer. In embodiments in which the epitaxial source/drain regions 102 include three semiconductor material layers, the first semiconductor material layer may be grown, the second semiconductor material layer may be grown over the first semiconductor material layer, and the third semiconductor material layer may be grown over the second semiconductor material layer.

Figures 11A, 11B:
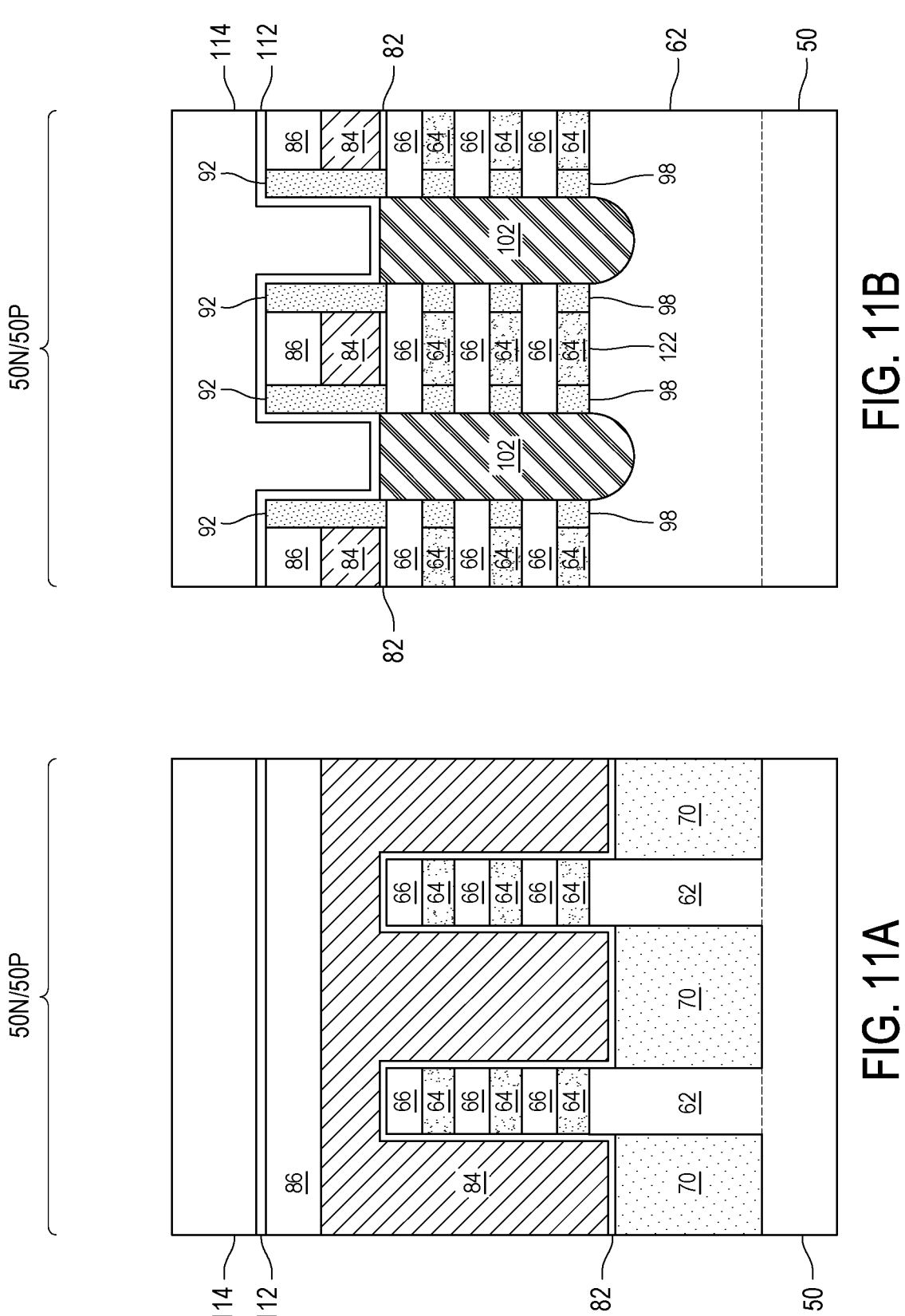

In FIGS. 11A-11B, a first ILD 114 is deposited over the epitaxial source/drain regions 102, the gate spacers 92, and the masks 86 (if present) or the dummy gates 84. The first ILD 114 may be formed of a dielectric material, which may be deposited by any suitable method, such as CVD, plasma-enhanced CVD (PECVD), or FCVD. Dielectric materials may include phospho-silicate glass (PSG), boro-silicate glass (BSG), boron-doped phospho-silicate glass (BPSG), undoped silicate glass (USG), or the like. Other insulation materials formed by any acceptable process may be used.

In some embodiments, a contact etch stop layer (CESL) 112 is formed between the first ILD 114 and the epitaxial source/drain regions 102, the gate spacers 92, and the masks 86 (if present) or the dummy gates 84. The CESL 112 may be formed of a dielectric material having a high etching selectivity from the etching of the first ILD 114, such as, silicon nitride, silicon oxide, silicon oxynitride, or the like, which may be formed by any suitable deposition process, such as CVD, ALD, or the like.

Figures 12A, 12B:
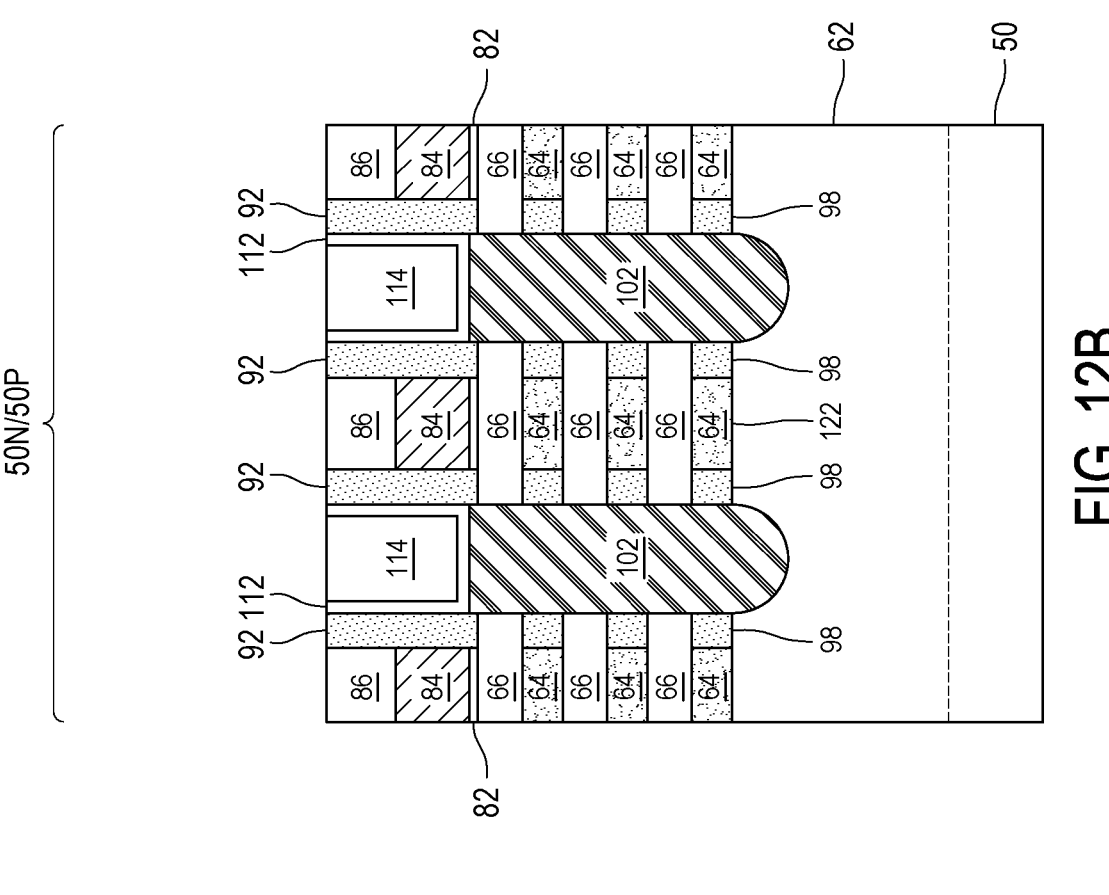

In FIGS. 12A-12B, a removal process is performed to level the top surfaces of the first ILD 114 with the top surfaces of the gate spacers 92 and the masks 86 (if present) or the dummy gates 84. In some embodiments, a planarization process such as a chemical mechanical polish (CMP), an etch-back process, combinations thereof, or the like may be utilized. The planarization process may also remove the masks 86 on the dummy gates 84, and portions of the gate spacers 92 along sidewalls of the masks 86. After the planarization process, top surfaces of the first ILD 114, the gate spacers 92, and the masks 86 (if present) or the dummy gates 84 are substantially coplanar (within process variations). Accordingly, the top surfaces of the masks 86 (if present) or the dummy gates 84 are exposed through the first ILD 114.

Figures 13A, 13B:
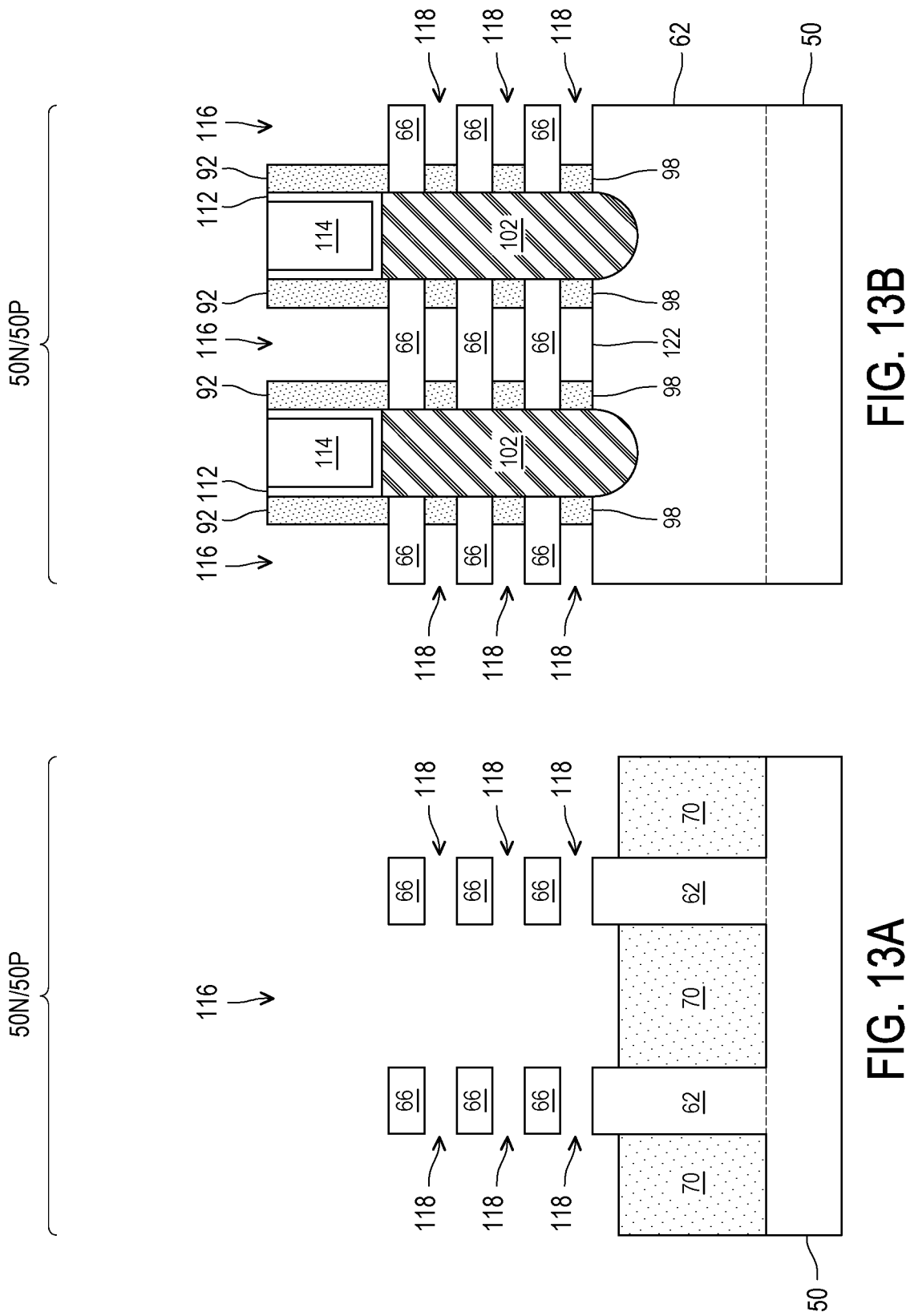

In FIGS. 13A-13B, the masks 86 (if present) and the dummy gates 84 are removed in one or more etching steps, so that recesses 116 are formed between the gate spacers 92. Portions of the dummy dielectrics 82 in the recesses 116 are also removed. In some embodiments, the dummy gates 84 and the dummy dielectrics 82 are removed by an anisotropic dry etch process. For example, the etching process may include a dry etch process using reaction gas(es) that selectively etch the material of the dummy gates 84 at a faster rate than the materials of the first ILD 114 and the gate spacers 92. Each recesses 116 exposes and/or overlies portions of nanostructures 64, 66 which act as the channel regions in subsequently completed nanostructure-FETs. The nanostructures 64, 66 which act as the channel regions are disposed between neighboring pairs of the epitaxial source/drain regions 102. During the removal, the dummy dielectrics 82 may be used as etch stop layers when the dummy gates 84 are etched. The dummy dielectrics 82 may then be removed after the removal of the dummy gates 84.

The remaining portions of the first nanostructures 64 are then removed to form openings 118 in regions between the second nanostructures 66. The remaining portions of the first nanostructures 64 can be removed by any acceptable etch process that selectively etches the material of the first nanostructures 64 at a faster rate than the material of the second nanostructures 66. The etching may be isotropic. For example, when the first nanostructures 64 are formed of silicon germanium and the second nanostructures 66 are formed of silicon, the etch process may be a wet etch using tetramethylammonium hydroxide (TMAH), ammonium hydroxide ($NH_4OH$), or the like. In some embodiments, a trim process (not separately illustrated) is performed to decrease the thickness of the exposed portions of the second nanostructures 66 and expand the openings 118.

Figures 14A, 14B:
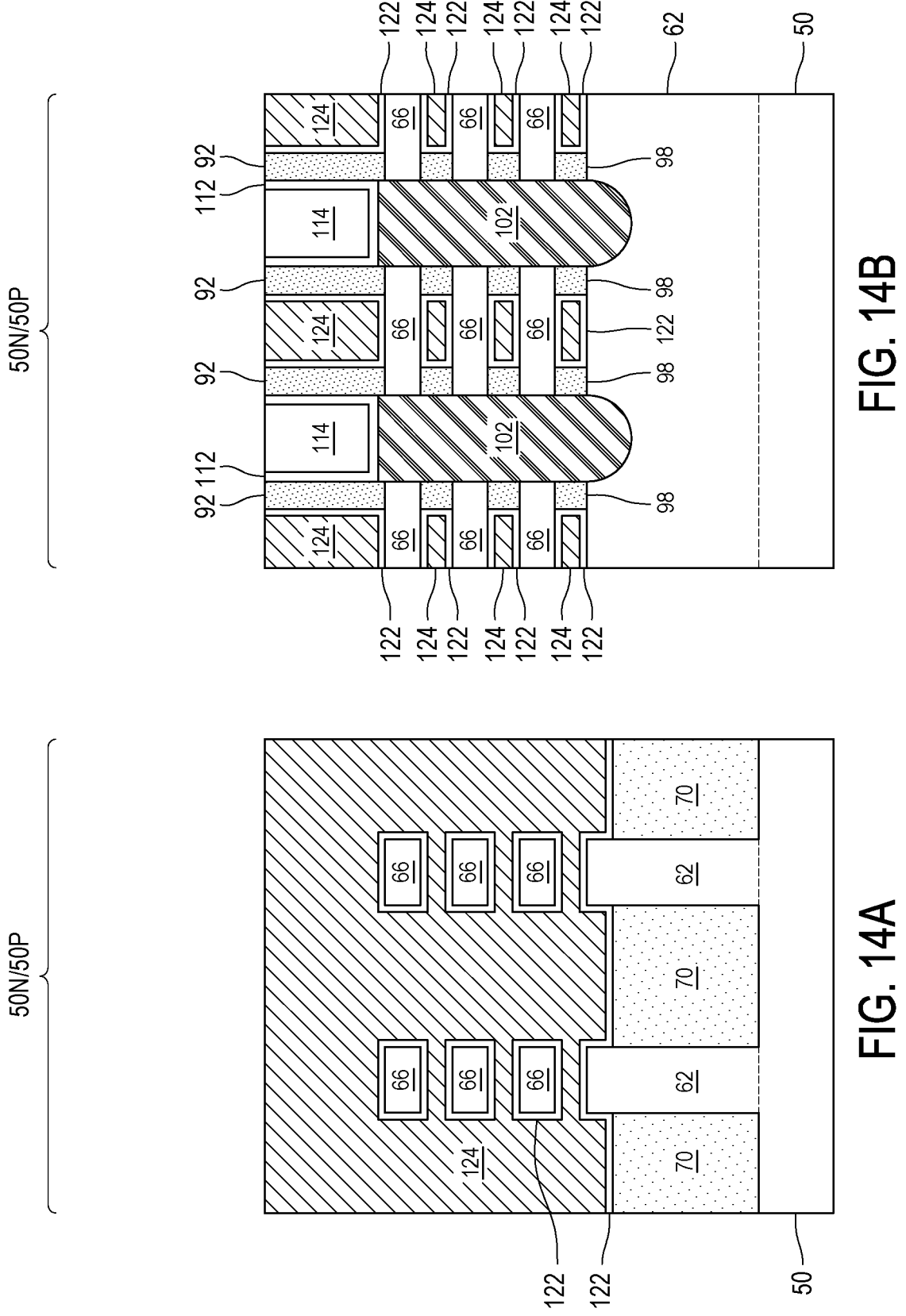

In FIGS. 14A-14B, gate dielectrics 122 and gate electrodes 124 are formed for replacement gates. Each respective pair of a gate dielectric 122 and a gate electrode 124 may be collectively referred to as a "gate structure." Each gate structure is wrapped around a channel region of a nanostructure 66, such that the gate structure extends along sidewalls, a bottom surface, and a top surface of the nanostructure 66. Some of the gate structures also extend along sidewalls and/or a top surface of a fin 62.

The gate dielectrics 122 include one or more gate dielectric layer(s) disposed on the sidewalls and/or the top surfaces of the fins 62; on the top surfaces, the sidewalls, and the bottom surfaces of the channel regions of the nanostructures 66; on the sidewalls of the inner spacers 98 adjacent the epitaxial source/drain regions 102; and on the sidewalls of the gate spacers 92. The gate dielectrics 122 may be formed of an oxide such as silicon oxide or a metal oxide, a silicate such as a metal silicate, combinations thereof, multi-layers thereof, or the like. Additionally or alternatively, the gate dielectrics 122 may be formed of a high-k dielectric material (e.g., dielectric materials having a k-value greater than about 7.0), such as a metal oxide or a silicate of hafnium, aluminum, zirconium, lanthanum, manganese, barium, titanium, lead, and combinations thereof. The dielectric material(s) of the gate dielectrics 122 may be formed by molecular-beam deposition (MBD), ALD, PECVD, or the like. Although single-layered gate dielectrics 122 are illustrated, the gate dielectrics 122 may include any number of interfacial layers and any number of main layers. For example, the gate dielectrics 122 may include an interfacial layer and an overlying high-k dielectric layer.

The gate electrodes 124 include one or more gate electrode layer(s) disposed over the gate dielectrics 122. The gate electrodes 124 may be formed of a metal-containing material such as titanium nitride, titanium oxide, tantalum nitride, tantalum carbide, tungsten, cobalt, ruthenium, aluminum, combinations thereof, multi-layers thereof, or the like. Although single-layered gate electrodes 124 are illustrated, the gate electrodes 124 may include any number of work function tuning layers, any number of barrier layers, any number of glue layers, and a fill material.

As an example to form the gate structures, one or more gate dielectric layer(s) may be deposited in the recesses 116 and the openings 118. The gate dielectric layer(s) may also be deposited on the top surfaces of the first ILD 114 and the gate spacers 92. Subsequently, one or more gate electrode layer(s) may be deposited on the gate dielectric layer(s), and in the remaining portions of the recesses 116 and the openings 118. A removal process may then be performed to remove the excess portions of the gate dielectric layer(s) and the gate electrode layer(s), which excess portions are over the top surfaces of the first ILD 114 and the gate spacers 92. In some embodiments, a planarization process such as a chemical mechanical polish (CMP), an etch-back process, combinations thereof, or the like may be utilized. The gate dielectric layer(s), after the removal process, have portions remaining in the recesses 116 and the openings 118 (thus forming the gate dielectrics 122). The gate electrode layer(s), after the removal process, have portions remaining in the recesses 116 and the openings 118 (thus forming the gate electrodes 124). When a planarization process it utilized, the top surfaces of the gate spacers 92, the first ILD 114, the gate dielectrics 122, and the gate electrodes 124 are coplanar (within process variations).

Figures 15A, 15B:
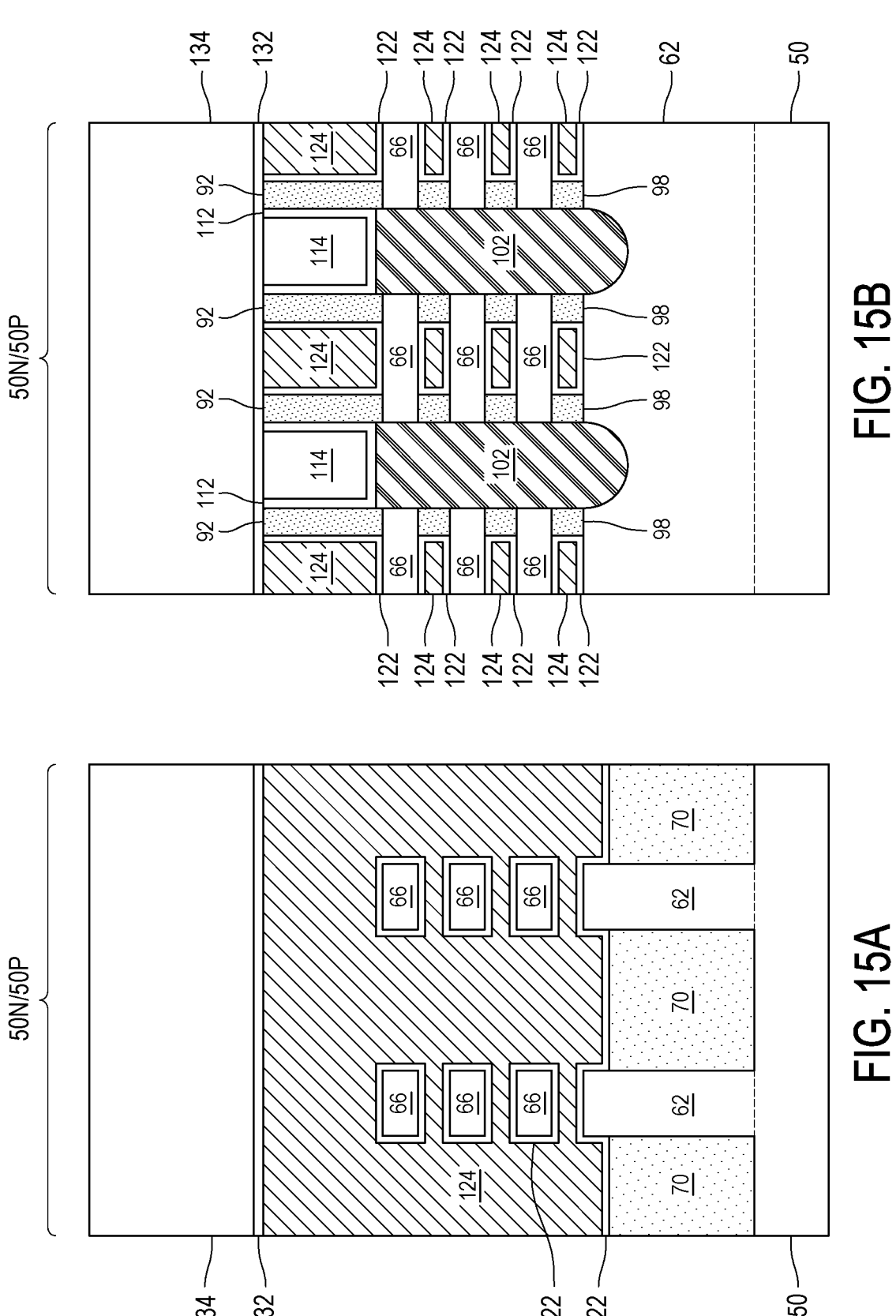

In FIGS. 15A-15B, a second ILD 134 is deposited over the gate spacers 92, the first ILD 114, the gate dielectrics 122, and the gate electrodes 124. In some embodiments, the second ILD 134 is a flowable film formed by a flowable CVD method. In some embodiments, the second ILD 134 is formed of a dielectric material such as PSG, BSG, BPSG, USG, or the like, which may be formed by any suitable deposition process, such as CVD, PECVD, or the like.

In some embodiments, an etch stop layer (ESL) 132 is formed between the second ILD 134 and the gate spacers 92, the first ILD 114, the gate dielectrics 122, and the gate electrodes 124. The ESL 132 may be formed of a dielectric material having a high etching selectivity from the etching of the second ILD 134, such as silicon nitride, silicon oxide, silicon oxynitride, or the like, which may be formed by any suitable deposition process, such as CVD, ALD, or the like.

Figures 16A, 16B:
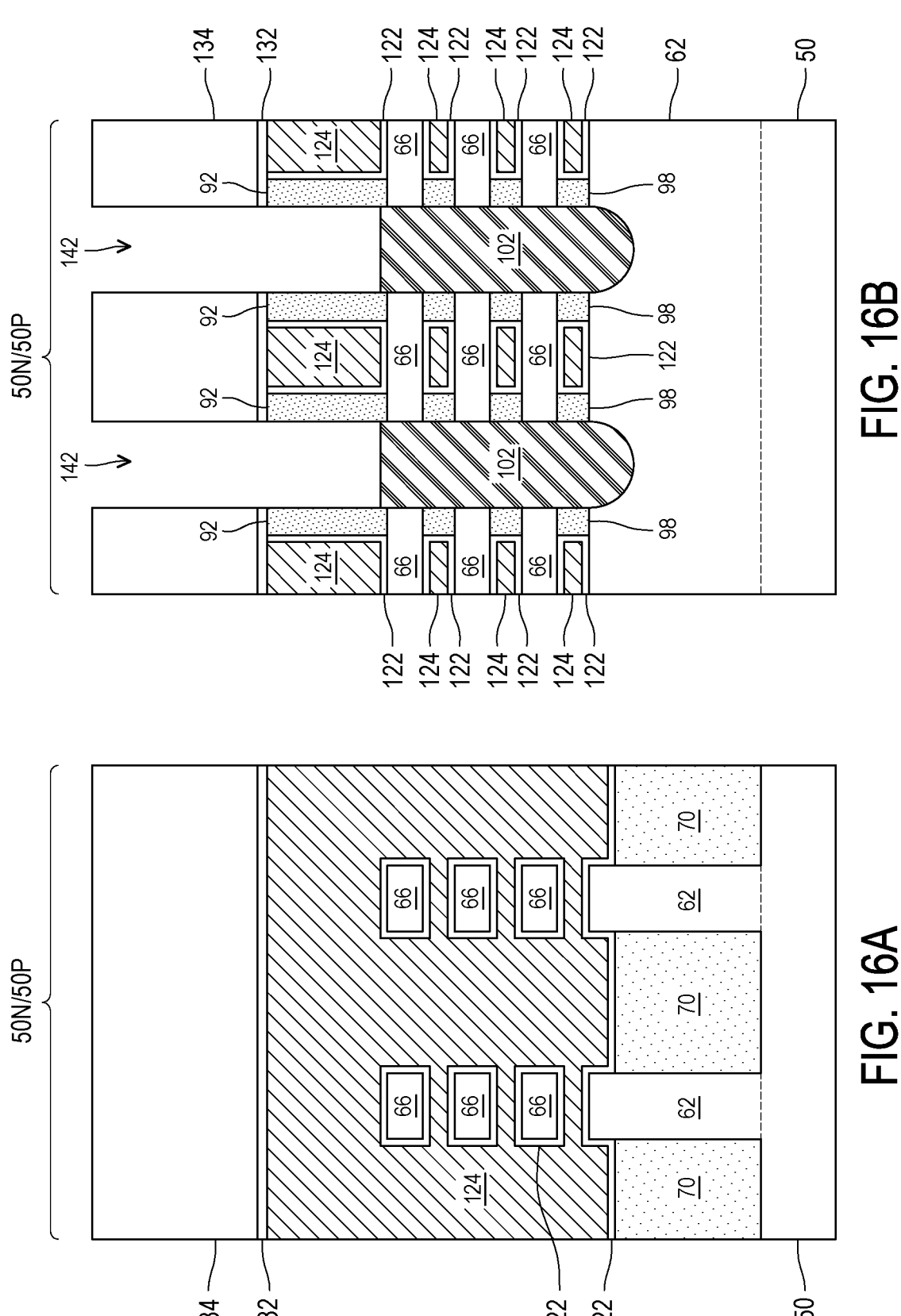

In FIGS. 16A-16B, contact openings 142 for source/drain contacts are patterned through the second ILD 134, the ESL 132, the first ILD 114, and the CESL 112. The epitaxial source/drain regions 102 are exposed by the contact openings 142. The contact openings 142 may be patterned using acceptable photolithography and etching techniques. In some embodiments, the contact openings 142 are formed by a self-aligned contact (SAC) process.

Figures 17A, 17B:
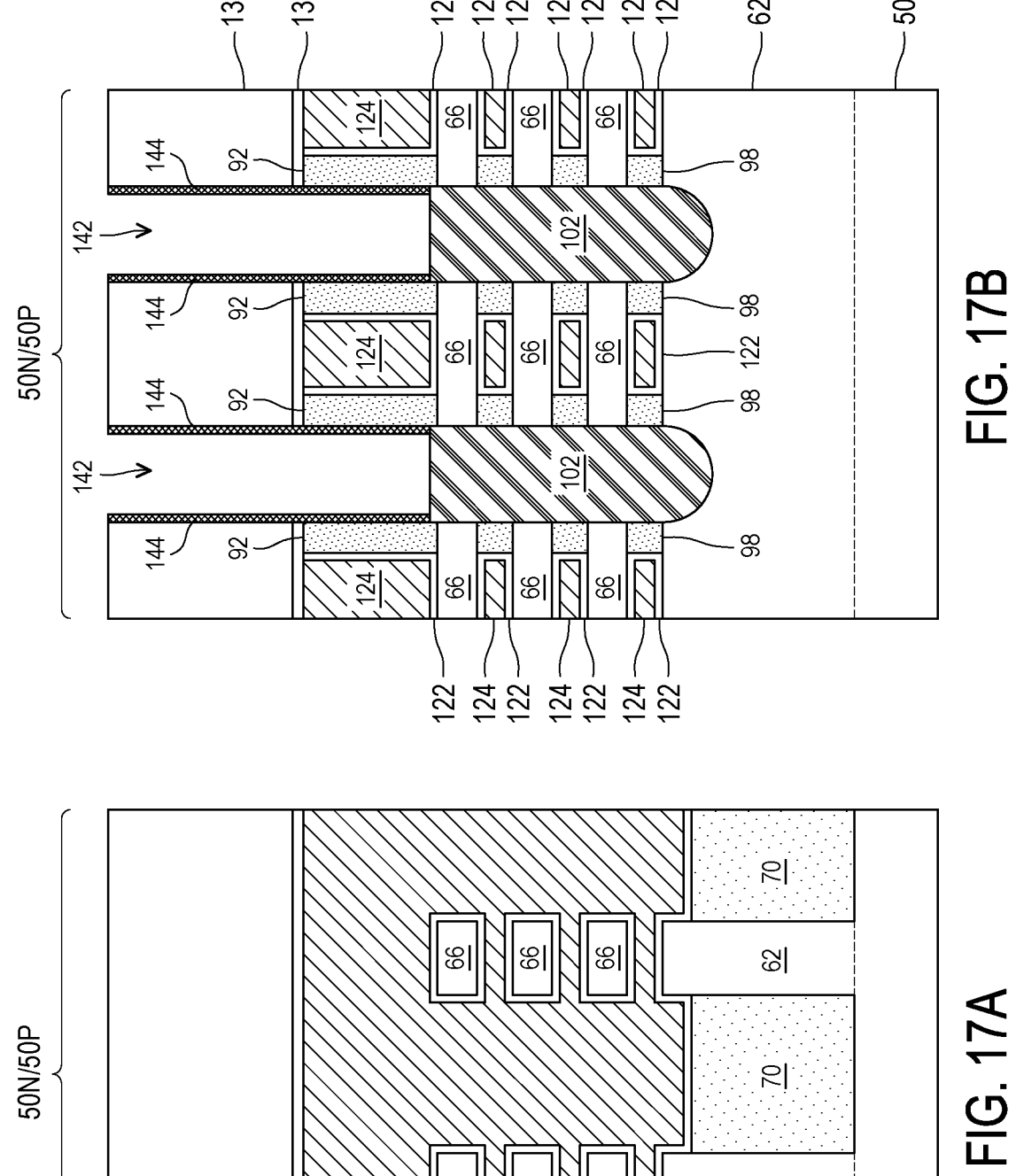

In FIGS. 17A-17B, sacrificial spacers 144 are formed in the contact openings 142, such as on the sidewalls of the second ILD 134 and the gate spacers 92. The sacrificial spacers 144 may also be on the sidewalls of the first ILD 114 in another cross-section (not separately illustrated). The sacrificial spacers 144 may be formed by conformally forming a sacrificial material and subsequently etching the sacrificial material. The sacrificial material has a high etching selectivity with subsequently formed contact spacers (discussed below). Acceptable sacrificial materials may include non-conductive materials such as undoped silicon, silicon oxide, silicon nitride, silicon oxycarbonitride, or the like, which may be formed by a deposition process, such as CVD, ALD, or the like. In some embodiments, the sacrificial material is undoped silicon formed by a deposition process such as CVD. Other materials formed by any acceptable process may be used. Any acceptable etch process, such as a dry etch, a wet etch, the like, or a combination thereof, may be performed to pattern the sacrificial material. The etching may be anisotropic. The sacrificial material, when etched, has portions left on the sidewalls of the contact openings 142 (thus forming the sacrificial spacers 144). The sacrificial spacers 144 have a small thickness (measured from the sidewalls of the contact openings 142). In some embodiments, the sacrificial spacers 144 have a thickness in the range of 1 nm to 3 nm, such as about 1.5 nm.

Figures 18A, 18B:
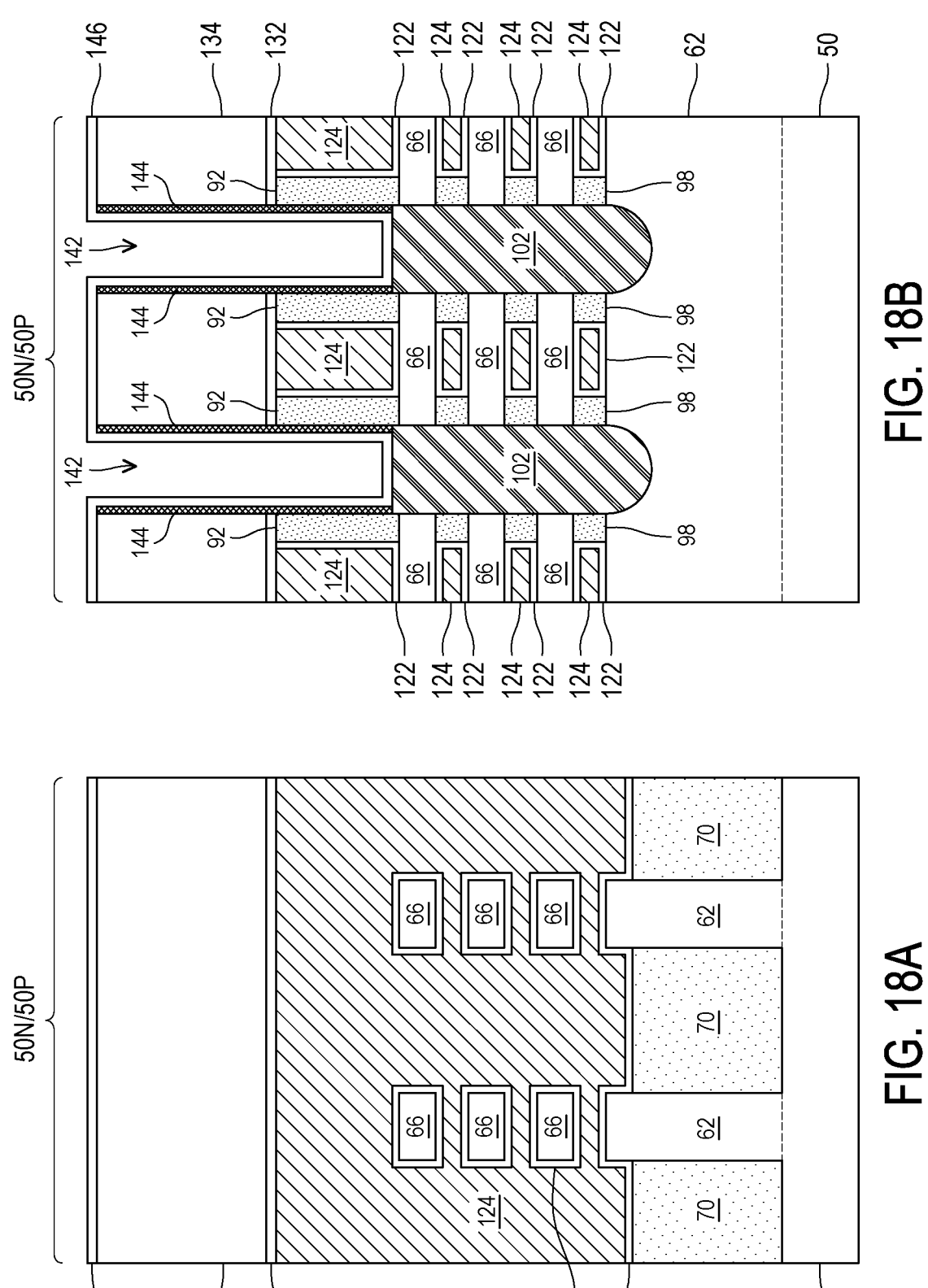

In FIGS. 18A-18B, a spacer layer 146 is deposited on the sacrificial spacers 144 and in the contact openings 142. The spacer layer 146 is on and extends along the top surfaces of the epitaxial source/drain regions 102 and the sidewalls of the sacrificial spacers 144. The spacer layer 146 may be formed of a dielectric material, such as silicon nitride, silicon oxide, silicon oxynitride, aluminum oxide, or the like, which may be formed by a deposition process, such as CVD, ALD, or the like. In some embodiments, the spacer layer 146 and the ESL 132 and/or the CESL 112 are formed of the same dielectric material. In some embodiments, the spacer layer 146 is a layer of silicon nitride formed by a deposition process such as ALD. The spacer layer 146 has a larger thickness (measured from the sidewalls of the contact openings 142) than the sacrificial spacers 144. In some embodiments, the spacer layer 146 has a thickness in the range of 1 nm to 5 nm, such as about 3 nm.

Figures 19A, 19B:
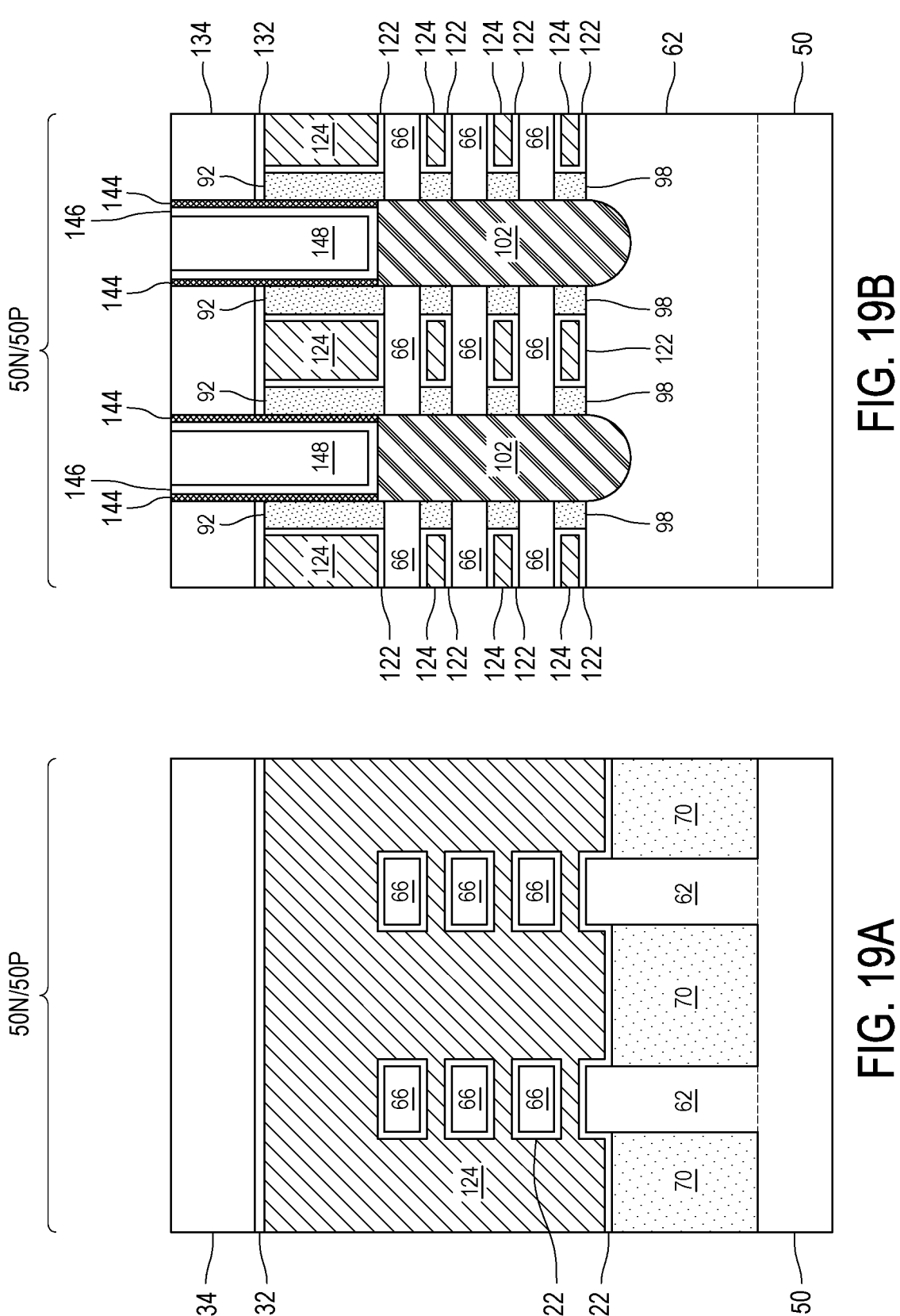

In FIGS. 19A-19B, a protective dielectric 148 is formed on the spacer layer 146 and in the contact openings 142. The protective dielectric 148 fills the remainder of the contact openings 142 and will protect the epitaxial source/drain regions 102 during a subsequent plasma treatment process. The spacer layer 146 is disposed between the protective dielectric 148 and the sacrificial spacers 144. The protective dielectric 148 may be formed by depositing a protective material over the spacer layer 146 and subsequently performing a removal process on the protective material to remove the excess portions of the protective material, which excess portions are over the top surface of the second ILD 134. Acceptable protective materials may include silicon-based dielectric materials such as silicon oxycarbide, silicon oxycarbonitride, silicon oxide, silicon nitride, silicon carbide, silicon carbonitride, silicon oxynitride, or the like, which may be formed by a deposition process such as chemical vapor deposition (CVD), atomic layer deposition (ALD), or the like. In some embodiments, the protective dielectric 148 is formed of silicon oxycarbide. The protective material of the protective dielectric 148 may be different from the material of the spacer layer 146. The removal process is performed to level the top surfaces of the protective dielectric 148 with the top surfaces of the spacer layer 146, the sacrificial spacers 144, and the second ILD 134. In some embodiments, a planarization process such as a chemical mechanical polish (CMP), an etch-back process, combinations thereof, or the like may be utilized. After the planarization process, top surfaces of the protective dielectric 148, the spacer layer 146, the sacrificial spacers 144, and the second ILD 134 are substantially coplanar (within process variations). Accordingly, the top surfaces of the protective dielectric 148 are exposed through the second ILD 134.

Figures 20A, 20B:
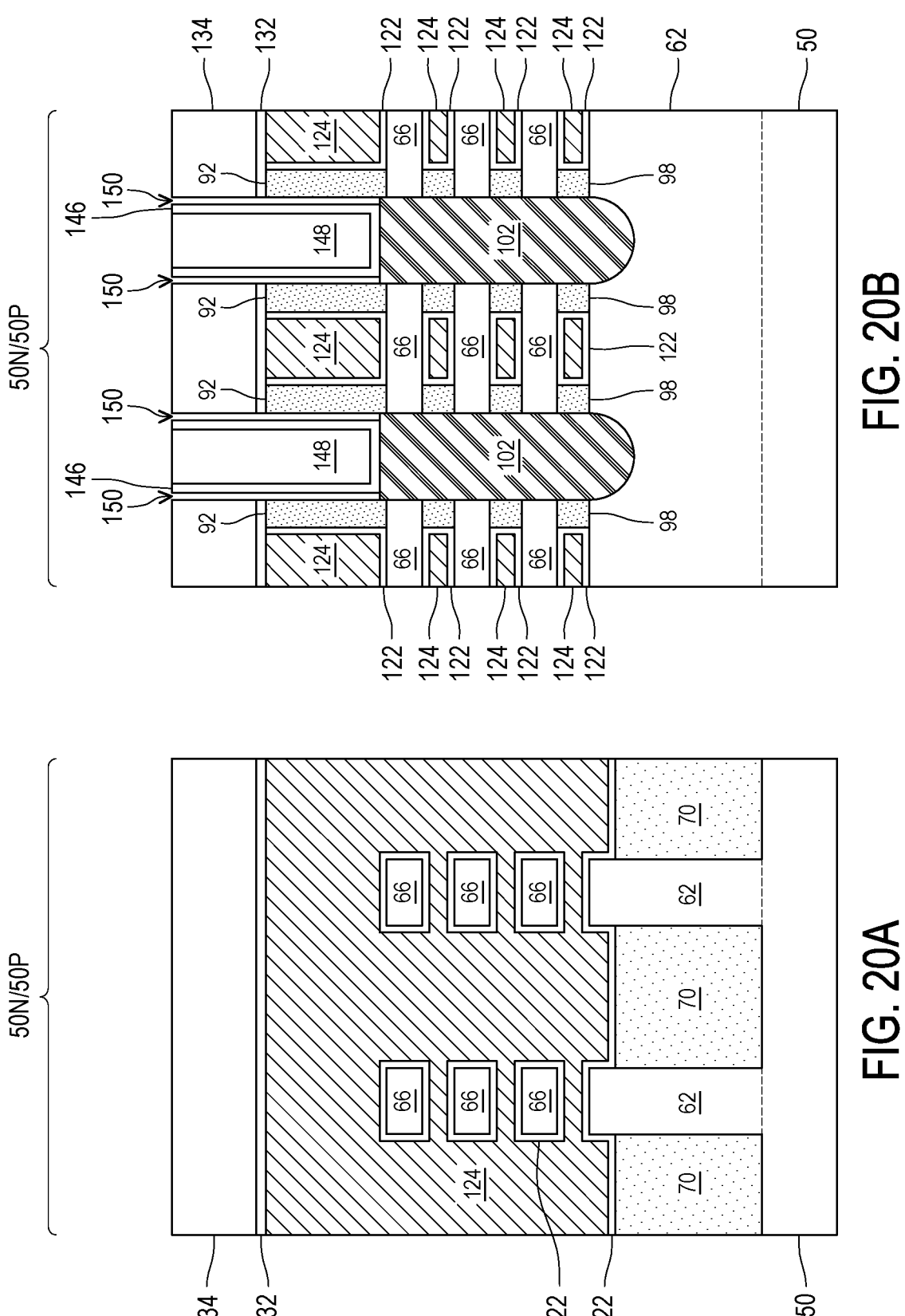

In FIGS. 20A-20B, at least portions of the sacrificial spacers 144 are removed to form recesses 150 between the spacer layer 146 and the second ILD 134 and the gate spacers 92. The recesses 150 are adjacent the spacer layer 146, and are over the epitaxial source/drain regions 102. The recesses 150 may also be between the spacer layer 146 and the first ILD 114 in another cross-section (not separately illustrated). The sacrificial spacers 144 may be removed by any acceptable etch process, such as one that is selective to the material of the sacrificial spacers 144 (e.g., selectively etches the material of the sacrificial spacers 144 at a faster rate than the materials of the protective dielectric 148, the spacer layer 146, and the second ILD 134). The width of the recesses 150 is substantially the same as the thickness of the sacrificial spacers 144. Accordingly, when the sacrificial spacers 144 have a small thickness, the recesses 150 have a small width. In this embodiment, an entirety of the sacrificial spacers 144 is removed such that no residual portions of the sacrificial spacers 144 remain on the epitaxial source/drain regions 102 after the etching process. Accordingly, the epitaxial source/drain regions 102 are exposed to the recesses 150. In another embodiment (subsequently described for FIGS. 26A-26B), only portions of the sacrificial spacers 144 are removed, such that some residual portions of the sacrificial spacers 144 remain on the epitaxial source/drain regions 102 after the etching process.

Figures 21A, 21B:
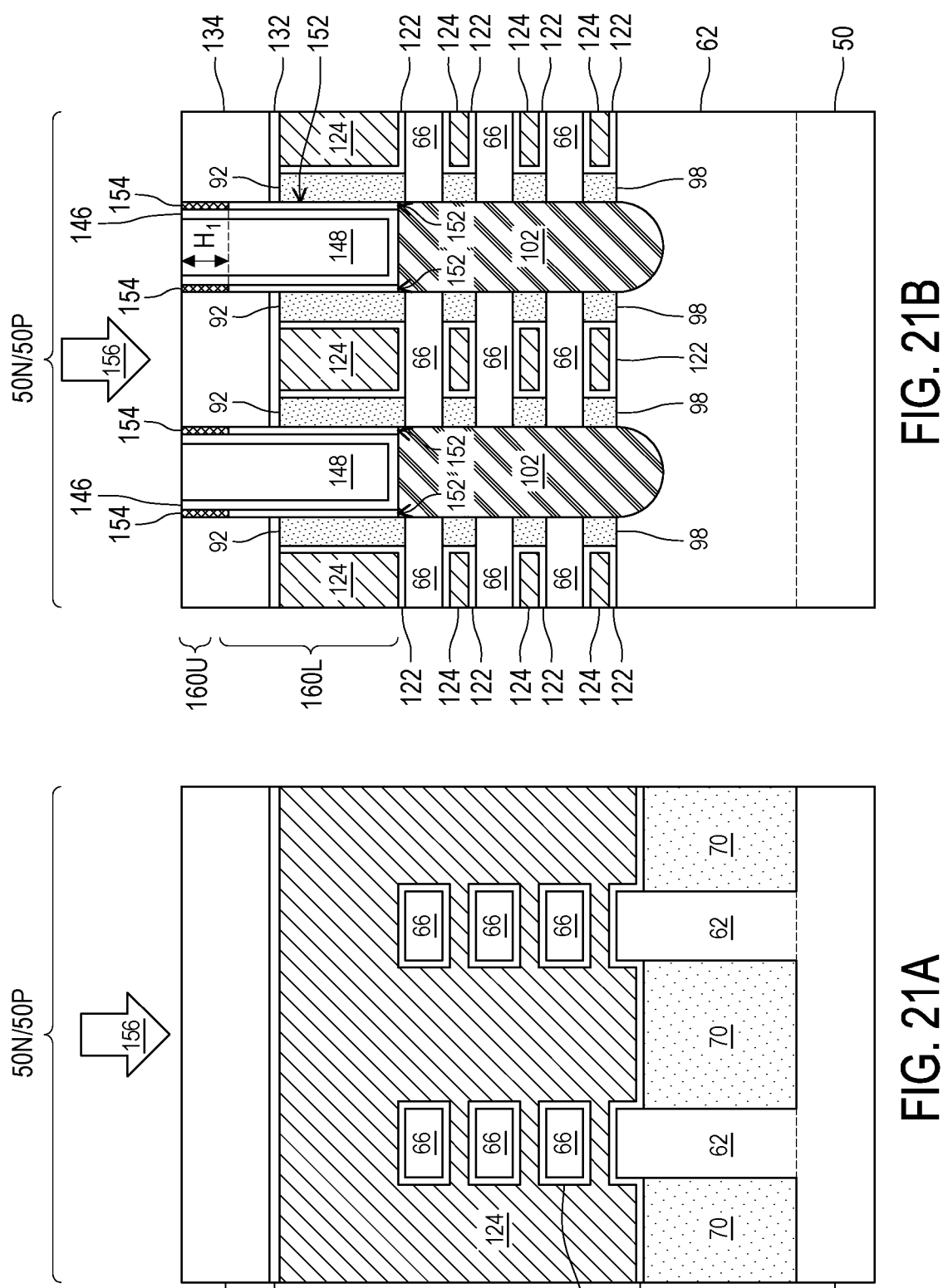

In FIGS. 21A-21B, dielectric caps 154 are formed in the upper portions of the recesses 150, thereby sealing the lower portions of the recesses 150 to form voids 152. The voids 152 thus include at least some of the area previously occupied by the sacrificial spacers 144. The dielectric caps 154 are formed between the spacer layer 146 and the second ILD 134. The dielectric caps 154 are not form in the lower portions of the recesses 150. Accordingly, the voids 152 comprise the lower portions of the recesses 150 that are not filled by the dielectric caps 154. The voids 152 are thus defined at least in part by the dielectric caps 154. The voids 152 are filled with a vacuum or air, both of which have a low relative permittivity (e.g., a low k-value). The voids 152 help electrically isolate the gate electrodes 124 from subsequently formed source/drain contacts. The width (or thickness) of the dielectric caps 154 and the width of the voids 152 is substantially the same as the width of the recesses 150. Accordingly, when the recesses 150 have a small width, the dielectric caps 154 and the voids 152 have a small width. The dielectric caps 154 have a height $H_1$ measured from beneath the top surface of the second ILD 134. In some embodiments, the height $H_1$ is in the range of 8.47 nm to 12.89 nm, such as about 12 nm. The dielectric caps 154 are formed by performing a plasma treatment process 156 on the second ILD 134, the spacer layer 146, and the protective dielectric 148. As subsequently described in greater detail, the height $H_1$ of the dielectric caps 154 may be controlled by controlling parameters of the plasma treatment process 156.

The second ILD 134, the spacer layer 146, and the protective dielectric 148 are bombarded with ions during the plasma treatment process 156. The ion bombardment causes sputtering of portions of the second ILD 134, the spacer layer 146, and/or the protective dielectric 148. The material of the sputtered portions is redeposited. Specifically, the materials of the protective dielectric 148, the spacer layer 146, and/or the second ILD 134 are redeposited in the upper portions of the recesses 150 (e.g., between the spacer layer 146 and the second ILD 134), thereby forming the dielectric caps 154. The dielectric caps 154 therefore include a combination of the redeposited materials. In some embodiments, the materials of the protective dielectric 148 and the spacer layer 146 are redeposited, and the dielectric caps 154 include a combination of the materials of the protective dielectric 148 and the spacer layer 146. The redeposited materials may combine to form a new compound, which is the material of the dielectric caps 154. In some embodiments where the spacer layer 146 is formed of silicon nitride and the protective dielectric 148 is formed of silicon oxycarbide, the dielectric caps 154 are formed of silicon oxycarbonitride.

The second ILD 134, the spacer layer 146, and the protective dielectric 148 are also bombarded with radicals during the plasma treatment process 156. The radical bombardment densifies (e.g., increase the density of) upper regions 160U of the second ILD 134, the spacer layer 146, the protective dielectric 148, and the dielectric caps 154. The radical bombardment affects the upper regions 160U of the second ILD 134, the spacer layer 146, the protective dielectric 148, and the dielectric caps 154 more than it affects lower regions 160L of the second ILD 134, the spacer layer 146, the protective dielectric 148, and the dielectric caps 154. Accordingly, the upper regions 160U of the second ILD 134, the spacer layer 146, the protective dielectric 148, and the dielectric caps 154 each have a greater density than the lower regions 160L of the second ILD 134, the spacer layer 146, the protective dielectric 148, and the dielectric caps 154, respectively. In some embodiments, the dielectric caps 154 are initially formed of low-density silicon oxycarbonitride containing C—H bonds, and the radical bombardment removes hydrogen terminations to cause Si—O—Si, Si—N—Si, and/or Si—C—Si crosslinking and form high-density silicon oxycarbonitride. A similar reaction may occur when densifying the second ILD 134, the spacer layer 146, the protective dielectric 148.

The plasma treatment process 156 is performed by generating a plasma (including the ions and the radicals). In some embodiments, the generated plasma is a nitrogen plasma, which includes nitrogen ions ($N^+$) and nitrogen radicals ($N^*$). The amount of ions in the generated plasma determines the redeposition rate of the material(s) of the dielectric caps 154, and the amount of radicals in the generated plasma determines the densification rate of the upper regions 160U. The generated plasma is ion-dominant, including more ions than radicals, such that a quantity of ions in the generated plasma is greater than a quantity of radicals in the generated plasma. In some embodiments, the generated plasma includes from about 50% to about 70% ions (such as about 70% ions) and from about 30% to about 50% radicals (such as about 30% radicals). If the generated plasma has too few ions or too many radicals, then the redeposition rate will be too slow. If the generated plasma has too few radicals or too many ions, then the densification rate will be too slow.

The plasma treatment process 156 may be performed in a processing chamber of a processing tool. A gas source is dispensed in the processing chamber. In some embodiments where the generated plasma is a nitrogen plasma, the gas source includes a nitrogen-containing gas and a carrier gas. The nitrogen-containing gas may include nitrogen gas ($N_2$) or the like. The carrier gas may be an inert gas such as Ar, He, Xe. Ne. Kr. Rn, the like, or combinations thereof. Optionally, oxygen gas ($O_2$) or hydrogen gas ($H_2$) may also be included in the gas source. A plasma is generated from the gas source. The plasma may be generated by a plasma generator such as an inductively coupled plasma system, a capacitively coupled plasma system, a microwave plasma generator, or the like. The plasma generator generates radio frequency power that produces a plasma by exciting the gas source to a plasma state. The plasma generation power determines the ratio of ions to radicals. In some embodiments, the plasma generation power is the range of 500 watts to 3000 watts. A plasma generation power outside of this range may not generate a desired quantity of ions and radicals (previously described). The plasma may be generated at a temperature in the range of 350° C. to 500° C. A pressure in the processing chamber may be in the range of 10 mTorr to 100 Torr. A bias voltage or bias power may be applied to the plasma generate during plasma generation. In some embodiments, an applied bias power is pulsed between a low power (e.g., substantially zero watts) and a high power, which may be in the range of 10 watts to 999 watts. The plasma treatment process 156 may be performed for a duration in the range of 10 seconds to 999 seconds.

The height $H_1$ of the dielectric caps 154 may be controlled by controlling the duration and the plasma generation bias power of the plasma treatment process 156. A smaller duration and/or smaller plasma generation bias power results in a smaller height $H_1$ of the dielectric caps 154. A larger duration and/or larger plasma generation bias power results in a larger height $H_1$ of the dielectric caps 154. During a design process, a height of the dielectric caps 154 may be determined; subsequently, during manufacturing, the plasma generation bias power may be applied according to the determined height. In some embodiments, the duration is in the range of 10 seconds to 60 seconds and the plasma generation bias power is in the range of 10 watts to 100 watts, which may result in a height $H_1$ of about 8.47 nm. In some embodiments, the duration is in the range of 61 seconds to 300 seconds and the plasma generation bias power is in the range of 101 watts to 300 watts, which may result in a height $H_1$ of about 9.57 nm. In some embodiments, the duration is in the range of 301 seconds to 999 seconds and the plasma generation bias power is in the range of 301 watts to 999 watts, which may result in a height $H_1$ of about 12.89 nm. Another duration or the plasma generation bias power may be utilized to obtain a desired height $H_1$.

Figures 22A, 22B:
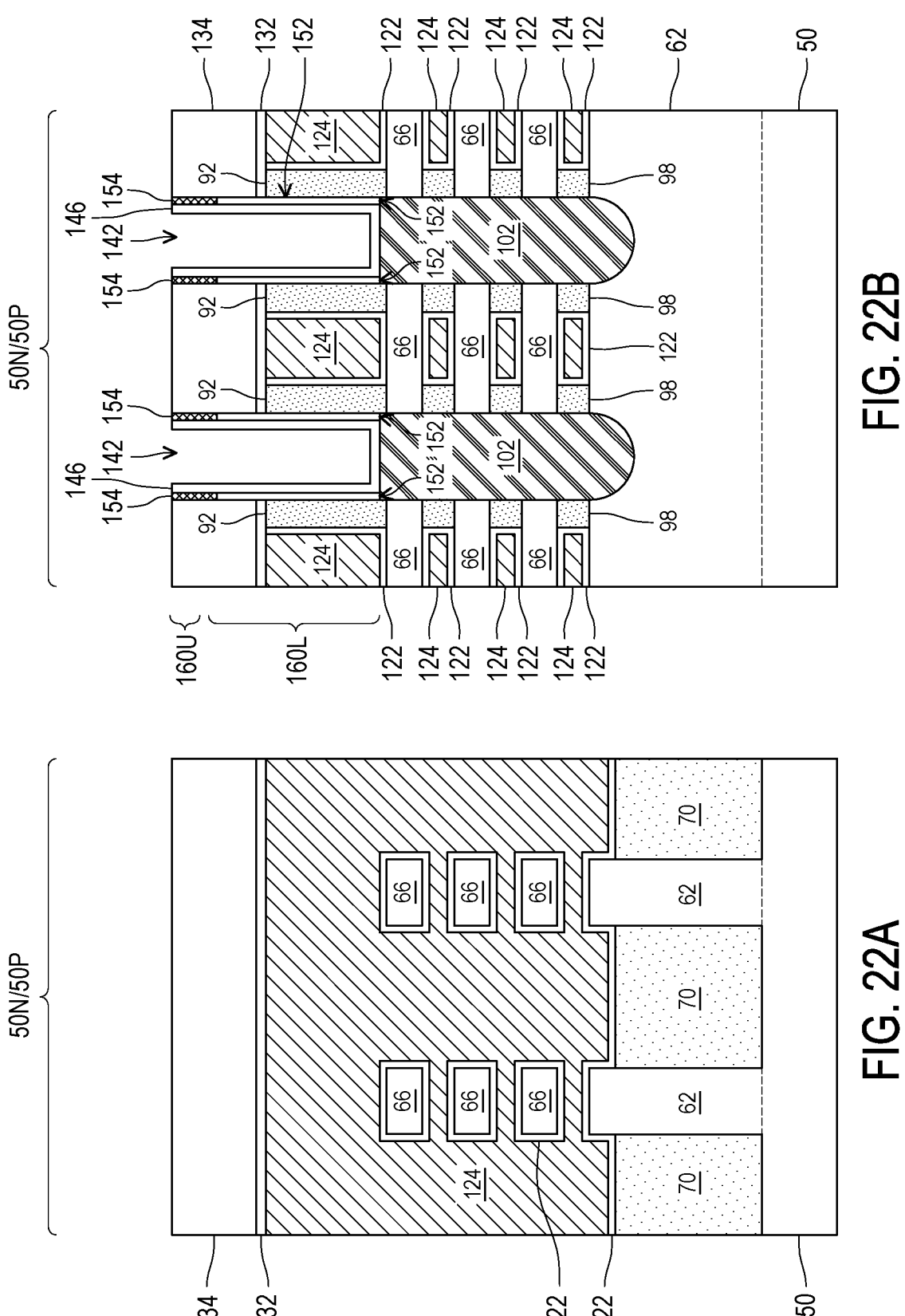

In FIGS. 22A-22B, the protective dielectric 148 is removed from the contact openings 142. Accordingly, the spacer layer 146 is exposed in the contact openings 142. Any acceptable etch process, such as a dry etch, a wet etch, the like, or a combination thereof, may be performed to remove the protective dielectric 148. The etching may be anisotropic. The etching may be selective to the protective dielectric 148 (e.g., selectively etches the material of the protective dielectric 148 at a faster rate than the materials of the dielectric caps 154, the spacer layer 146, and the second ILD 134). In some embodiments, the etching process is a dry etch performed with hydrochloric (HCl) acid, nitrogen trifluoride ($NF_3$), hydrofluoric (HF) acid, a combination thereof, or the like.

Figures 23A, 23B:
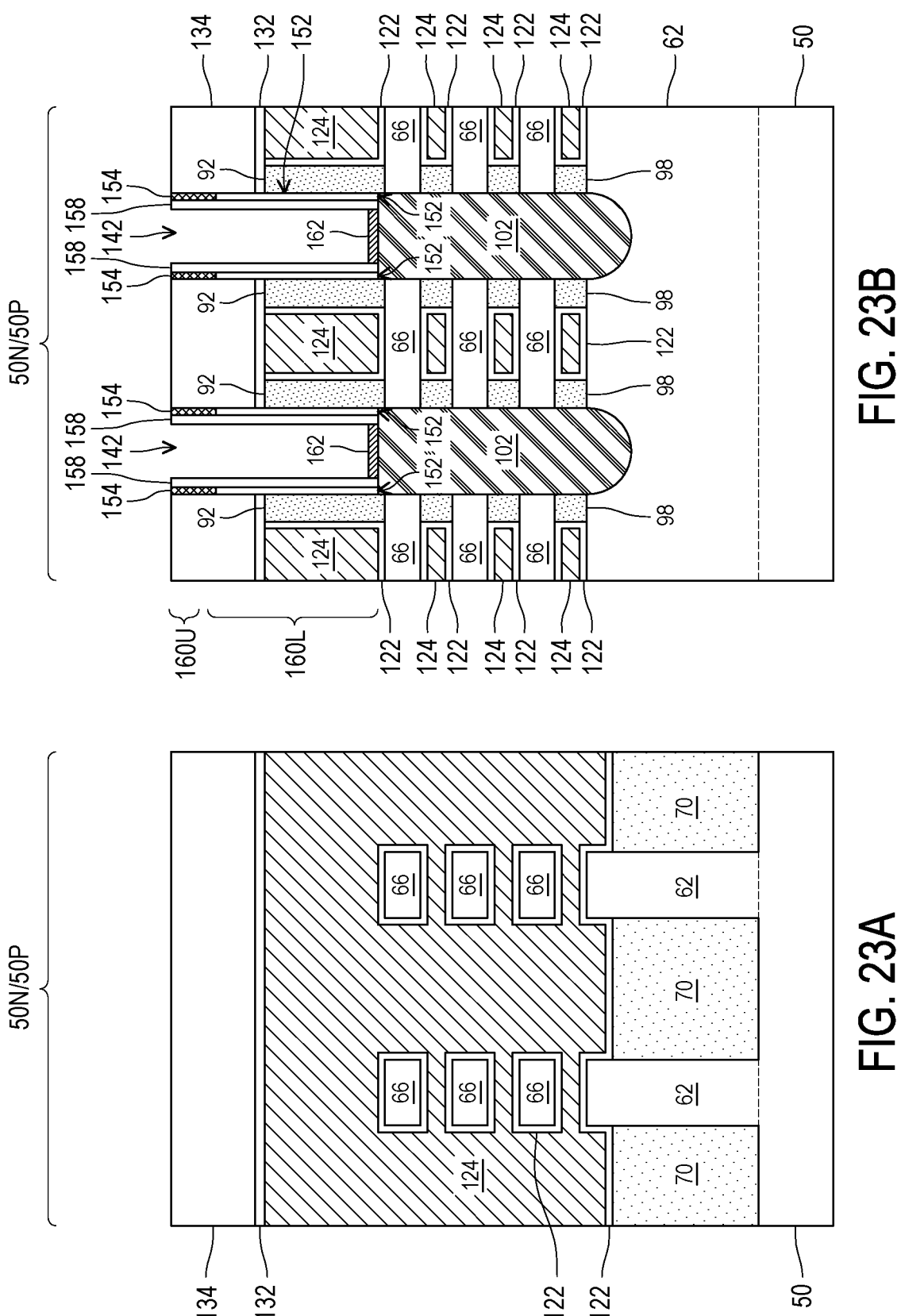

In FIGS. 23A-23B, the spacer layer 146 is patterned to form contact spacers 158. Any acceptable etch process, such as a dry etch, a wet etch, the like, or a combination thereof, may be performed to pattern the spacer layer 146. The etching may be anisotropic. The etching may be selective to the spacer layer 146 (e.g., selectively etches the material of the spacer layer 146 at a faster rate than the materials of the dielectric caps 154 and the second ILD 134). The spacer layer 146, when etched, has portions left on the sidewalls of the contact openings 142 (thus forming the contact spacers 158). Etching the spacer layer 146 removes the horizontal portions of the spacer layer 146 over the epitaxial source/drain regions 102, thereby exposing the epitaxial source/drain regions 102.

Optionally, metal-semiconductor alloy regions 162 are formed on the epitaxial source/drain regions 102. The metal-semiconductor alloy regions 162 can be silicide regions formed of a metal silicide (e.g., titanium silicide, cobalt silicide, nickel silicide, etc.), germanide regions formed of a metal germanide (e.g. titanium germanide, cobalt germanide, nickel germanide, etc.), silicon germanide regions formed of both a metal silicide and a metal germanide, or the like. The metal-semiconductor alloy regions 162 may be formed by depositing a metal in the contact openings 142 and then performing a thermal annealing process. The metal can be any metal capable of reacting with the semiconductor materials (e.g., silicon, silicon carbide, silicon germanium, germanium, etc.) of the epitaxial source/drain regions 102 to form a low-resistance metal-semiconductor alloy, such as nickel, cobalt, titanium, tantalum, platinum, tungsten, other noble metals, other refractory metals, rare earth metals, or their alloys. The metal may be formed by a deposition process such as ALD, CVD, PVD, or the like. After the thermal annealing process, a cleaning process, such as a wet clean, may be performed to remove any residual metal from the contact openings 142, such as from surfaces of the metal-semiconductor alloy regions 162.

Figures 24A, 24B:
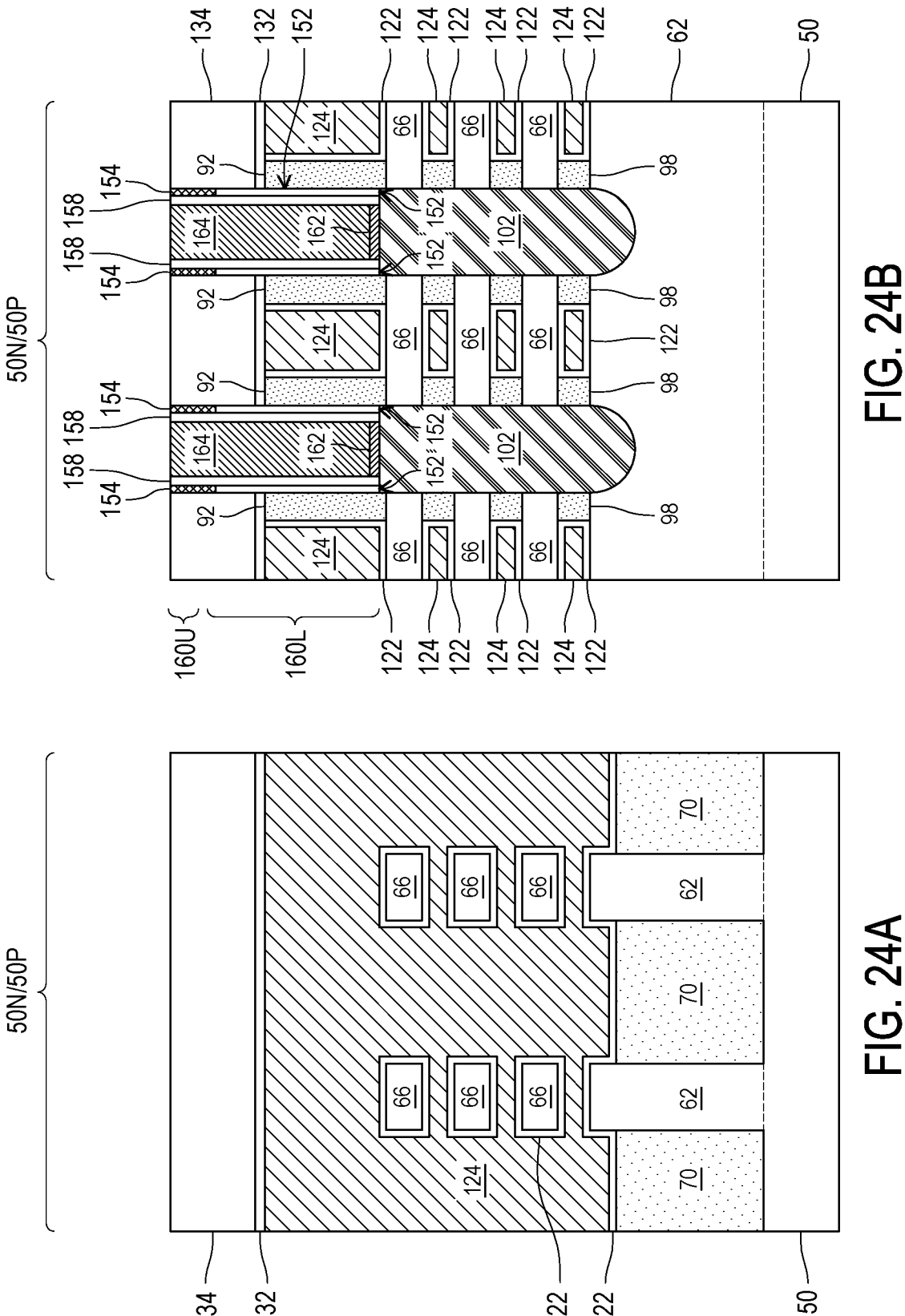

In FIGS. 24A-24B, source/drain contacts 164 are formed in the contact openings 142. The source/drain contacts 164 may be physically and electrically coupled to the epitaxial source/drain regions 102. Specifically, the source/drain contacts 164 may contact the metal-semiconductor alloy regions 162 (if present) or the epitaxial source/drain regions 102.

As an example to form the source/drain contacts 164, a liner (not separately illustrated), such as a diffusion barrier layer, an adhesion layer, or the like, and a conductive material may be formed in the contact openings 142. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from the top surfaces of the dielectric caps 154 and the second ILD 134. The remaining liner and conductive material form the source/drain contacts 164 in the contact openings 142. After the planarization process, top surfaces of the source/drain contacts 164, the contact spacers 158, the dielectric caps 154, and the second ILD 134 are substantially coplanar (within process variations).

The contact spacers 158 are between the source/drain contacts 164 and the dielectric caps 154. The contact spacers 158 and the dielectric caps 154 each extend around the source/drain contacts 164 in a top-down view (not separately illustrated) and may be circular in the top-down view. The dielectric caps 154 and the voids 152 are each between the contact spacers 158 and the second ILD 134 and the gate spacers 92. Additionally, the voids 152 are between the source/drain contacts 164 and the gate electrodes 124. In this embodiment, the voids 152 are defined by a combination of the contact spacers 158, the dielectric caps 154, the second ILD 134, the ESL 132, the epitaxial source/drain regions 102, and the gate spacers 92. The voids 152 provide more electrical isolation than dielectric spacers, and so forming the voids 152 helps provide a large amount of electrical isolation between the source/drain contacts 164 and the gate electrodes 124, thus decreasing the parasitic capacitance of the resulting FinFETs.

Figures 25A, 25B:
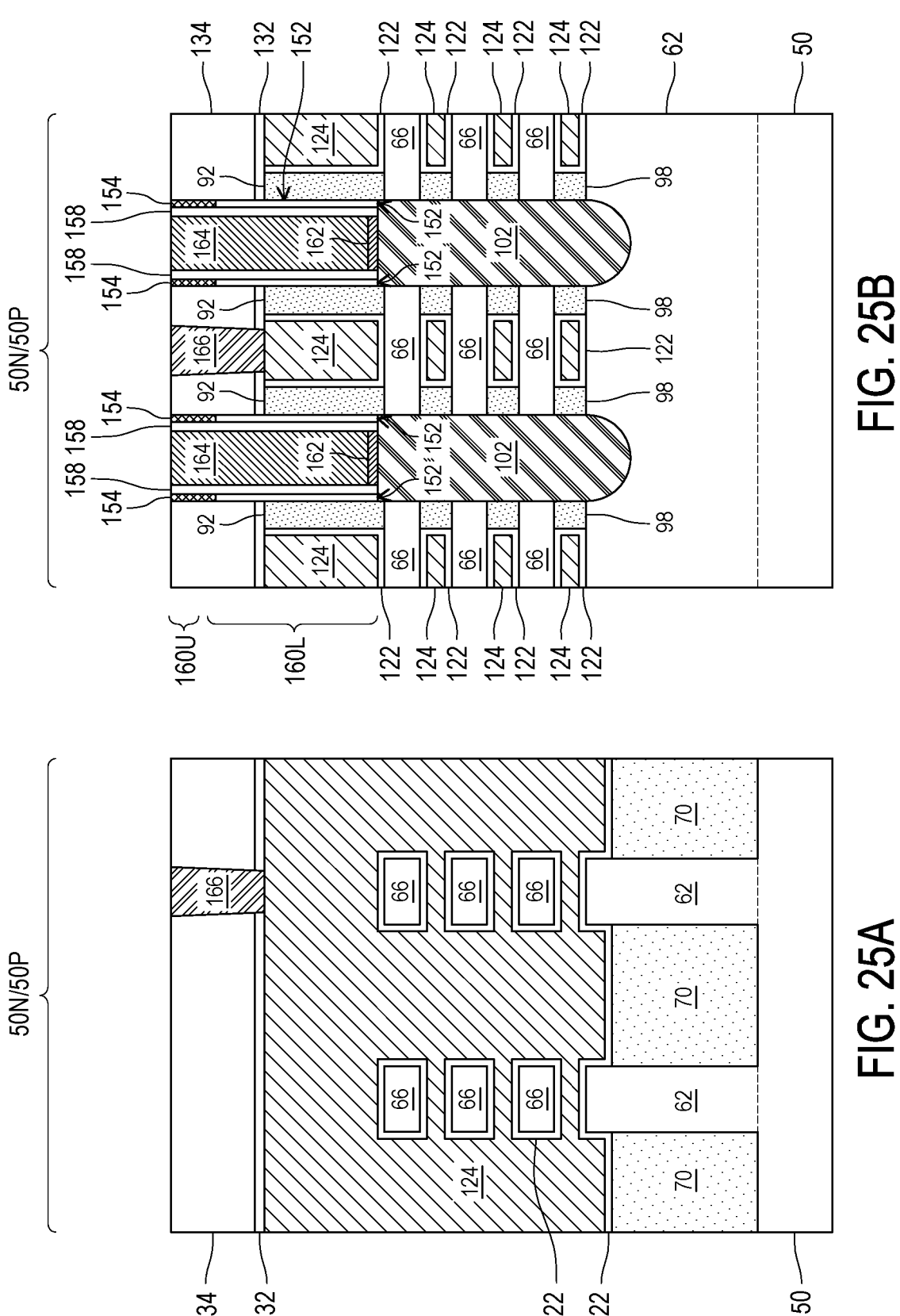

In FIGS. 25A-25B, gate contacts 166 are formed to contact the gate electrodes 124. The gate contacts 166 may be physically and electrically coupled to the gate electrodes 124.

As an example to form the gate contacts 166, openings for the gate contacts 166 are formed through the second ILD 134 and the ESL 132. The openings may be formed using acceptable photolithography and etching techniques. A liner (not separately illustrated), such as a diffusion barrier layer, an adhesion layer, or the like, and a conductive material are formed in the openings. The liner may include titanium, titanium nitride, tantalum, tantalum nitride, or the like. The conductive material may be copper, a copper alloy, silver, gold, tungsten, cobalt, aluminum, nickel, or the like. A planarization process, such as a CMP, may be performed to remove excess material from the top surfaces of the dielectric caps 154 and the second ILD 134. The remaining liner and conductive material form the gate contacts 166 in the openings. Although shown as being formed in the same cross-sections, it should be appreciated that each of the gate contacts 166 and the source/drain contacts 164 may be formed in different cross-sections, which may avoid shorting of the contacts.

Embodiments may achieve advantages. As noted above, the voids 152 and the recesses 150 may have a small width. The small width of the recesses 150 makes it difficult for deposition precursors to reach into the recesses 150. The materials sputtered during the plasma treatment process 156 may reach into the recesses 150 more easily than deposition precursors. Forming the dielectric caps 154 by sputtering and redeposition of portions of the second ILD 134, the spacer layer 146, and/or the protective dielectric 148 may thus be advantageous over forming the dielectric caps 154 by a deposition process such as CVD or ALD. Further, the upper regions 160U of the various components have an increased density as a result of the plasma treatment process 156, which may further improve electrical isolation. Additionally, the plasma treatment process 156 is a reliable, simple, and controllable process, which allows the height $H_1$ of the dielectric caps 154 to be easily controlled with fewer side effects (e.g., undesirable etching losses) than other processes.

Figures 26A, 26B:
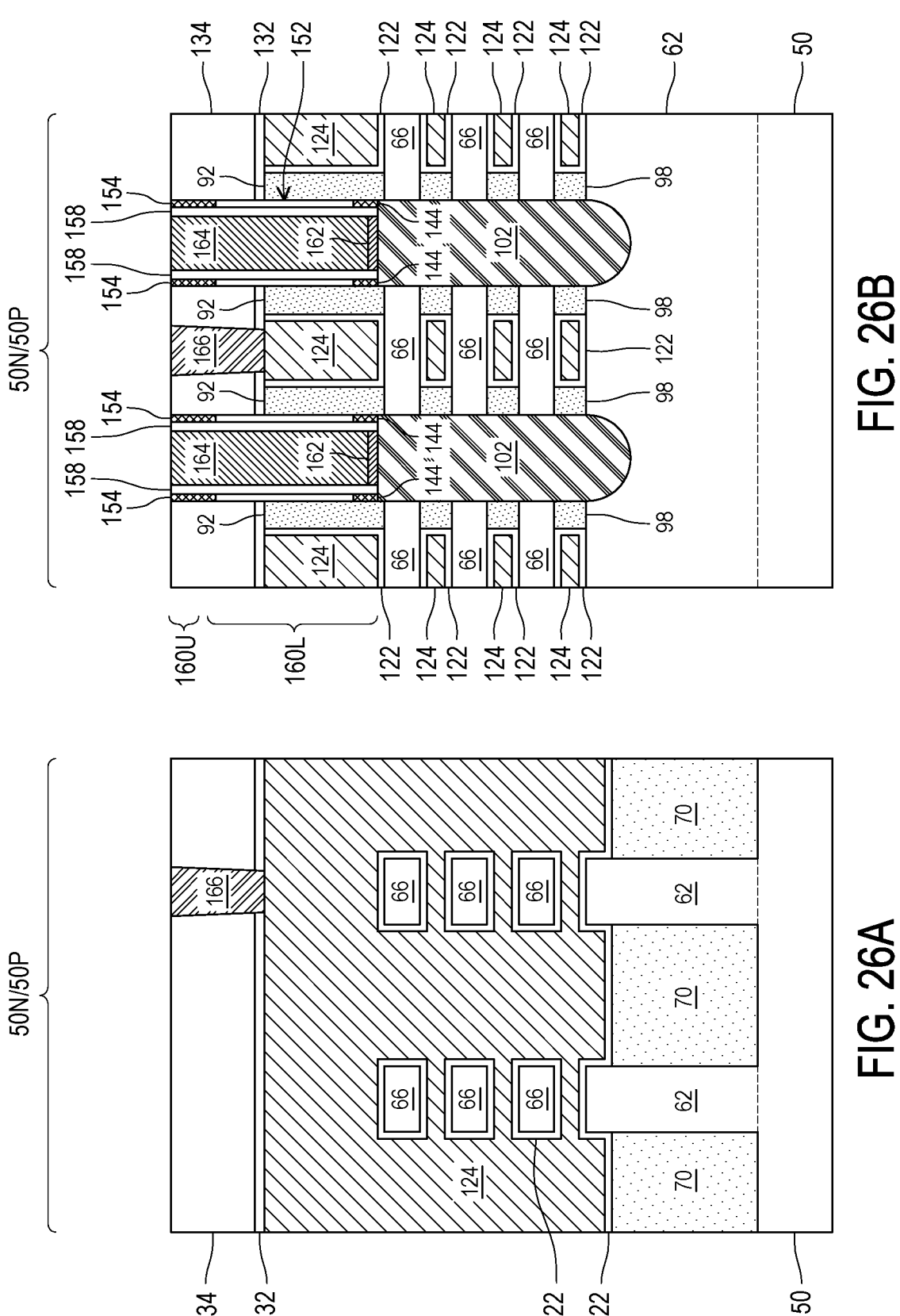
FIGS. 26A-26B are views of nanostructure-FETs, in accordance with some other embodiments.

FIGS. 26A-26B are views of nanostructure-FETs, in accordance with some other embodiments. This embodiment is similar to the embodiment of FIGS. 25A-25B, except some residual portions of the sacrificial spacers 144 remain on the epitaxial source/drain regions 102. Accordingly, the epitaxial source/drain regions 102 are not exposed to the recesses 150. In this embodiment, the voids 152 are defined by a combination of the contact spacers 158, the dielectric caps 154, the sacrificial spacers 144, the second ILD 134, the ESL 132, and the gate spacers 92.

In an embodiment, a method includes: forming a sacrificial spacer in a contact opening, the contact opening exposing a source/drain region; depositing a spacer layer on a sidewall of the sacrificial spacer and on a top surface of the source/drain region; forming a protective dielectric on the spacer layer and in the contact opening; removing the sacrificial spacer to form a recess adjacent the spacer layer; and forming a dielectric cap in an upper portion of the recess by redepositing a material of the protective dielectric and a material of the spacer layer in the upper portion of the recess, the dielectric cap sealing a lower portion of the recess to form a void. In some embodiments, the method further includes: patterning the contact opening through an inter-layer dielectric to expose the source/drain region, the recess formed between the spacer layer and the inter-layer dielectric. In some embodiments of the method, the dielectric cap is further formed by redepositing a material of the inter-layer dielectric in the upper portion of the recess. In some embodiments of the method, a material of the dielectric cap is a combination of the material of the protective dielectric and the material of the spacer layer. In some embodiments, the method further includes: removing the protective dielectric from the contact opening by selectively etching the material of the protective dielectric at a faster rate than the material of the dielectric cap. In some embodiments of the method, the material of the protective dielectric is silicon oxycarbide, and etching the protective dielectric includes performing a dry etch with hydrochloric acid, nitrogen trifluoride, hydrofluoric acid, or a combination thereof. In some embodiments, the method further includes: forming a gate structure on a channel region, the channel region adjacent the source/drain region; removing the protective dielectric from the contact opening; etching the spacer layer to form a contact spacer in the contact opening; and forming a source/drain contact in the contact opening, the contact spacer and the void disposed between the source/drain contact and the gate structure. In some embodiments of the method, redepositing the protective dielectric includes sputtering a portion of the protective dielectric by bombarding the protective dielectric with ions. In some embodiments of the method, removing the sacrificial spacer includes removing an entirety of the sacrificial spacer. In some embodiments of the method, removing the sacrificial spacer includes removing only a portion of the sacrificial spacer.

In an embodiment, a method includes: patterning a contact opening through an inter-layer dielectric to expose a source/drain region; forming a sacrificial spacer, a spacer layer, and a protective dielectric in the contact opening, the spacer layer disposed between the protective dielectric and the sacrificial spacer; removing the sacrificial spacer to form a recess between the spacer layer and the inter-layer dielectric; and forming a dielectric cap in an upper portion of the recess by performing a plasma treatment process, the plasma treatment process including bombarding the protective dielectric and the spacer layer with ions and with radicals. In some embodiments of the method, the plasma treatment process redeposits a material of the protective dielectric and a material of the spacer layer in the upper portion of the recess. In some embodiments of the method, the plasma treatment process densifies the dielectric cap. In some embodiments of the method, the plasma treatment process includes: generating a nitrogen plasma including the ions and the radicals, a quantity of the ions in the nitrogen plasma being greater than a quantity of the radicals in the nitrogen plasma. In some embodiments of the method, generating the nitrogen plasma includes exciting a gas source to a plasma state with a plasma generator, the gas source including nitrogen gas, an inert gas, and oxygen gas or hydrogen gas. In some embodiments, the method further includes: determining a desired height of the dielectric cap; and applying a bias power to the plasma generator according to the desired height of the dielectric cap.

In an embodiment, a device includes: a gate structure; a source/drain region adjacent the gate structure; an inter-layer dielectric over the source/drain region; a source/drain contact extending through the inter-layer dielectric to the source/drain region; a contact spacer around the source/drain contact; and a dielectric cap between the contact spacer and the inter-layer dielectric, the dielectric cap including a combination of a protective material and a material of the contact spacer, the dielectric cap defining a void between the source/drain contact and the gate structure. In some embodiments of the device, the protective material is silicon oxycarbide and the material of the contact spacer is silicon nitride. In some embodiments of the device, a thickness of the contact spacer is larger than a thickness of the dielectric cap. In some embodiments of the device, a density of an upper region of the dielectric cap is larger a density of a lower region of the dielectric cap.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method comprising:
forming a sacrificial spacer in a contact opening, the contact opening exposing a source/drain region;
depositing a spacer layer on a sidewall of the sacrificial spacer and on a top surface of the source/drain region;
forming a protective dielectric on the spacer layer and in the contact opening;
removing the sacrificial spacer to form a recess adjacent the spacer layer; and
forming a dielectric cap in an upper portion of the recess by redepositing a material of the protective dielectric and a material of the spacer layer in the upper portion of the recess, the dielectric cap sealing a lower portion of the recess to form a void, wherein redepositing the material of the protective dielectric comprises sputtering a portion of the protective dielectric.

2. The method of claim 1, further comprising:
patterning the contact opening through an inter-layer dielectric to expose the source/drain region, the recess formed between the spacer layer and the inter-layer dielectric.

3. The method of claim 2, wherein the dielectric cap is further formed by redepositing a material of the inter-layer dielectric in the upper portion of the recess.

4. The method of claim 1, wherein a material of the dielectric cap is a combination of the material of the protective dielectric and the material of the spacer layer.

5. The method of claim 4, further comprising:
removing the protective dielectric from the contact opening by selectively etching the material of the protective dielectric at a faster rate than the material of the dielectric cap.

6. The method of claim 5, wherein the material of the protective dielectric is silicon oxycarbide, and etching the protective dielectric comprises performing a dry etch with hydrochloric acid, nitrogen trifluoride, hydrofluoric acid, or a combination thereof.

7. The method of claim 1, further comprising:
forming a gate structure on a channel region, the channel region adjacent the source/drain region;
removing the protective dielectric from the contact opening;
etching the spacer layer to form a contact spacer in the contact opening; and forming a source/drain contact in the contact opening, the contact spacer and the void disposed between the source/drain contact and the gate structure.

8. The method of claim 1, wherein sputtering the portion of the protective dielectric comprises bombarding the protective dielectric with ions.

9. The method of claim 1, wherein removing the sacrificial spacer comprises removing an entirety of the sacrificial spacer.

10. The method of claim 1, wherein removing the sacrificial spacer comprises removing only a portion of the sacrificial spacer.

11. A method comprising:
patterning a contact opening through an inter-layer dielectric to expose a source/drain region;
forming a sacrificial spacer, a spacer layer, and a protective dielectric in the contact opening, the spacer layer disposed between the protective dielectric and the sacrificial spacer;
removing the sacrificial spacer to form a recess between the spacer layer and the inter-layer dielectric; and
forming a dielectric cap in an upper portion of the recess by performing a plasma treatment process, the plasma treatment process comprising sputtering portions of the protective dielectric and the spacer layer by bombarding the protective dielectric and the spacer layer with ions and with radicals.

12. The method of claim 11, wherein the plasma treatment process redeposits a material of the protective dielectric and a material of the spacer layer in the upper portion of the recess.

13. The method of claim 11, wherein the plasma treatment process densifies the dielectric cap.

14. The method of claim 11, wherein the plasma treatment process comprises:
generating a nitrogen plasma comprising the ions and the radicals, a quantity of the ions in the nitrogen plasma being greater than a quantity of the radicals in the nitrogen plasma.

15. The method of claim 14, wherein generating the nitrogen plasma comprises exciting a gas source to a plasma state with a plasma generator, the gas source comprising nitrogen gas, an inert gas, and oxygen gas or hydrogen gas.

16. The method of claim 15, further comprising:
determining a desired height of the dielectric cap; and
applying a bias power to the plasma generator according to the desired height of the dielectric cap.

17. A method comprising:
forming a source/drain region adjacent to a gate spacer;
forming an inter-layer dielectric over the source/drain region;
patterning a contact opening through the inter-layer dielectric to the source/drain region;
after patterning the contact opening through the inter-layer dielectric, depositing a contact spacer layer in the contact opening, the contact spacer layer formed on a sidewall of the contact opening and on a top surface of the source/drain region;
forming a dielectric cap between the contact spacer layer and the inter-layer dielectric, a material of the dielectric cap being a combination of a material of the contact spacer layer and a material of the inter-layer dielectric, the dielectric cap defining a void between the contact spacer layer and the gate spacer;
patterning the contact spacer layer to form a contact spacer; and
forming a source/drain contact in the contact opening.

18. The method of claim 17, wherein the material of the contact spacer layer is silicon nitride and the material of the inter-layer dielectric is silicon oxide.

19. The method of claim 17, wherein a thickness of the contact spacer is larger than a thickness of the dielectric cap.

20. The method of claim 17, further comprising:

increasing a density of an upper region of the dielectric cap to larger than a density of a lower region of the dielectric cap.

\* \* \* \* \*